United States Patent
Dejima et al.

(10) Patent No.: US 12,027,816 B2
(45) Date of Patent: Jul. 2, 2024

(54) METHOD OF MANUFACTURING LASER LIGHT SOURCE

(71) Applicant: NICHIA CORPORATION, Anan (JP)

(72) Inventors: Norihiro Dejima, Yokohama (JP); Hidenori Matsuo, Hadano (JP); Masaki Omori, Toshima-ku (JP); Hideaki Takeda, Kawasaki (JP)

(73) Assignee: NICHIA CORPORATION, Anan (JP)

( * ) Notice: Subject to any disclaimer, the term of this patent is extended or adjusted under 35 U.S.C. 154(b) by 473 days.

(21) Appl. No.: 17/239,981

(22) Filed: Apr. 26, 2021

(65) Prior Publication Data
US 2021/0336411 A1    Oct. 28, 2021

(30) Foreign Application Priority Data

Apr. 28, 2020   (JP) .................. 2020-079466

(51) Int. Cl.
*H01S 5/0237* (2021.01)
*H01S 5/02325* (2021.01)

(52) U.S. Cl.
CPC ........ *H01S 5/02325* (2021.01); *H01S 5/0237* (2021.01)

(58) Field of Classification Search
CPC ............... H01S 5/0239; H01S 5/02325; H01S 5/02326; H01S 5/02283; G02B 6/422; G02B 6/4222; G02B 6/4219; G02B 6/423; G02B 6/4237–4245
See application file for complete search history.

(56) References Cited

U.S. PATENT DOCUMENTS

| 5,544,184 A | 8/1996 | Wolak et al. |
| 10,061,084 B1 * | 8/2018 | Takayama ................ G02B 6/30 |
| 2003/0012521 A1 * | 1/2003 | Yokoyama ........... G02B 6/4224 |
| | | 385/88 |

(Continued)

FOREIGN PATENT DOCUMENTS

| JP | 2000-098190 A | 4/2000 |
| JP | 2002-232064 A | 8/2002 |

(Continued)

OTHER PUBLICATIONS https://www.indium.com/blog/eutectic-gold-tin-ausn.php?? p. 1-3 (Year: 2009).*

*Primary Examiner* — Tod T Van Roy
*Assistant Examiner* — Delma R Fordé
(74) *Attorney, Agent, or Firm* — Foley & Lardner LLP

(57) ABSTRACT

A method of manufacturing a laser light source includes: providing a submount, the submount having a principal surface on which a laser diode chip is to be fixed, and comprising a pair of lens supports each including an end surface, the end surfaces located at opposite sides with respect to an emission end surface of the laser diode chip; providing a lens having a bonding surface; performing adjustment such that end surfaces of the pair of lens supports of the submount are parallel to a reference plane; performing adjustment such that the bonding surface of the lens is parallel to the reference plane; and while maintaining the end surfaces of the pair of lens supports and the bonding surface of the lens so as to be parallel to the reference plane, bonding the end surfaces with the bonding surface of the lens using an inorganic bonding member.

21 Claims, 33 Drawing Sheets

(56) References Cited

U.S. PATENT DOCUMENTS

| | | | |
|---|---|---|---|
| 2004/0027631 A1 | 2/2004 | Nagano et al. | |
| 2005/0079716 A1 | 4/2005 | Yoshihara et al. | |
| 2017/0063034 A1* | 3/2017 | Tanisaka | H01L 21/67075 |
| 2022/0416501 A1* | 12/2022 | Matsuo | H01S 5/02253 |
| 2023/0318256 A1* | 10/2023 | Takeda | H01S 5/0236 |
| | | | 372/50.23 |

FOREIGN PATENT DOCUMENTS

| | | |
|---|---|---|
| JP | 2004-047651 A | 2/2004 |
| JP | 2005-136385 A | 5/2005 |
| JP | 2012-094728 A | 5/2012 |

* cited by examiner

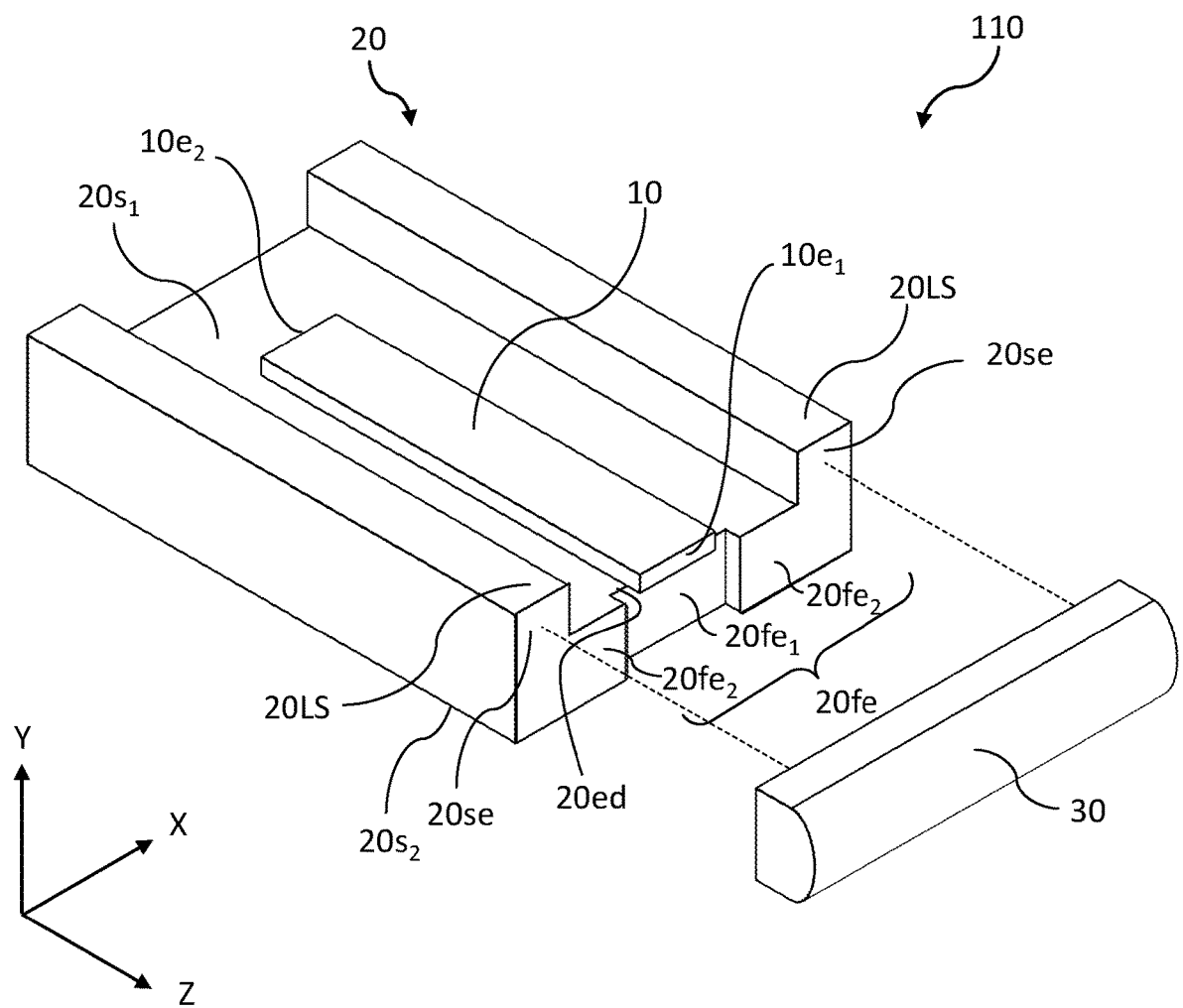

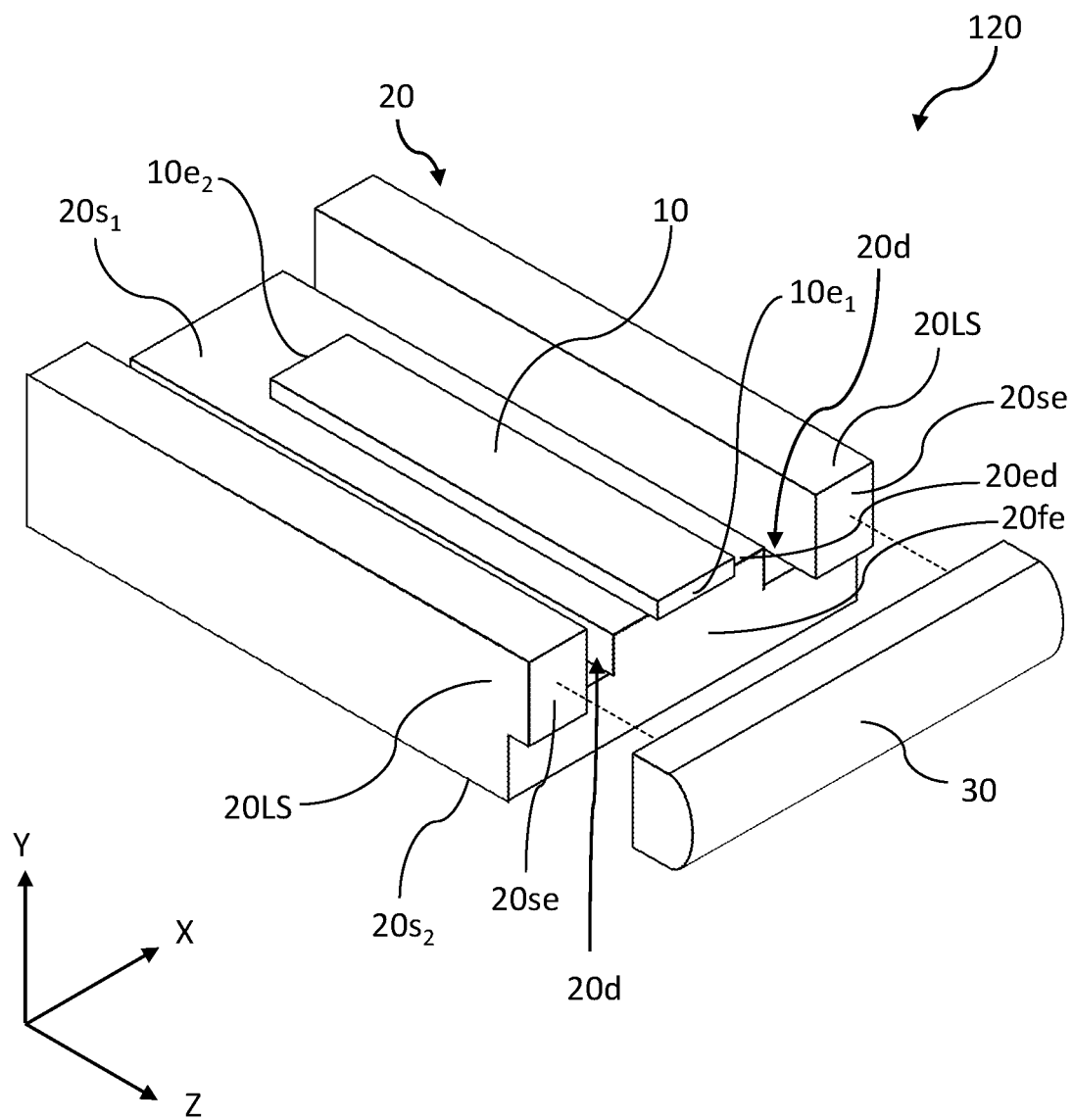

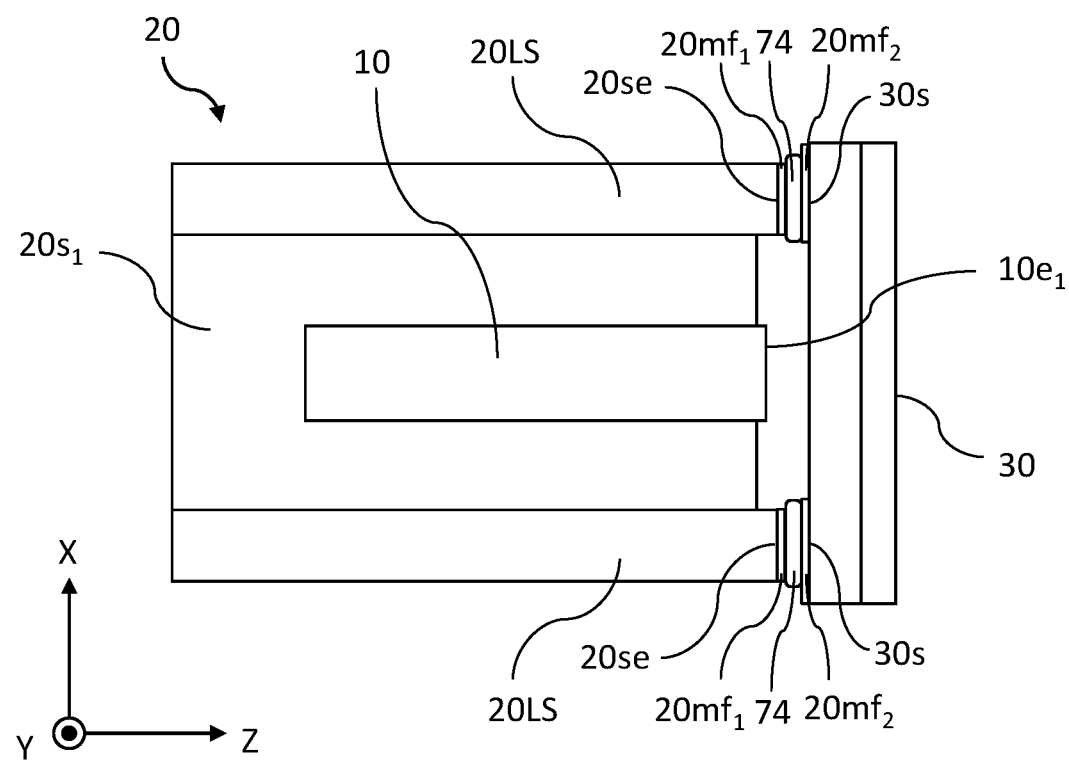

METHOD OF MANUFACTURING LASER LIGHT SOURCE

CROSS REFERENCE TO RELATED APPLICATION

This application claims priority to Japanese Patent Application No. 2020-079466, filed on Apr. 28, 2020, the entire contents of which are hereby incorporated by reference.

BACKGROUND

The present disclosure relates to a method of manufacturing a laser light source.

Laser light sources can be used for various applications, such as processing, projectors, and illumination devices. A typical example of such a laser light source may include a laser diode chip, a submount supporting the laser diode chip, and a collimating lens configured to reduce the divergence angle of laser light that is emitted from the laser diode chip (see, for example, Japanese Patent Publication No. 2000-98190). In the case in which a laser diode chip, a submount, and a lens such as a collimating lens are housed in a semiconductor laser package, the laser light can be collimated or the like at an appropriate degree of divergence by a small lens. On the other hand, even a slight misalignment between the laser diode chip and the lens may cause the optical axis of laser light that is emitted to the outside from the laser light source to be greatly misoriented.

SUMMARY

An object of certain embodiments of the present disclosure is to provide a laser light source in which misalignment between a laser diode chip and a lens is unlikely to occur.

A method of manufacturing a laser light source according to one embodiment of the present disclosure includes: providing a submount, the submount including: a principal surface on which a laser diode chip having an emission end surface is to be fixed, and a pair of lens supports each including an end surface, the end surfaces of the pair of lens supports located at opposite sides to each other with respect to the emission end surface of the laser diode chip; providing a lens having a bonding surface; performing adjustment such that end surfaces of the pair of lens supports of the submount are parallel to a reference plane; performing adjustment such that the bonding surface of the lens is parallel to the reference plane; and while maintaining the end surfaces of the pair of lens supports and the bonding surface of the lens so as to be parallel to the reference plane, bonding the end surfaces of the pair of lens supports with the bonding surface of the lens using an inorganic bonding member.

According to certain embodiments of the present disclosure, a laser light source can be realized in which a misalignment between a laser diode chip and a lens is unlikely to occur.

BRIEF DESCRIPTION OF THE DRAWINGS

FIG. 3A is a perspective view schematically showing an example of a configuration of a laser light source according to Modified Example 1 of the first embodiment of the present disclosure.

FIG. 4A is a perspective view schematically showing an example of a configuration of a laser light source according to Modified Example 2 of the first embodiment of the present disclosure.

FIG. 15D is a diagram for describing an example of a step in manufacturing the laser light source in the case in which the submount and the collimating lens are bonded using an inorganic bonding member.

DETAILED DESCRIPTION

Figure 1A:
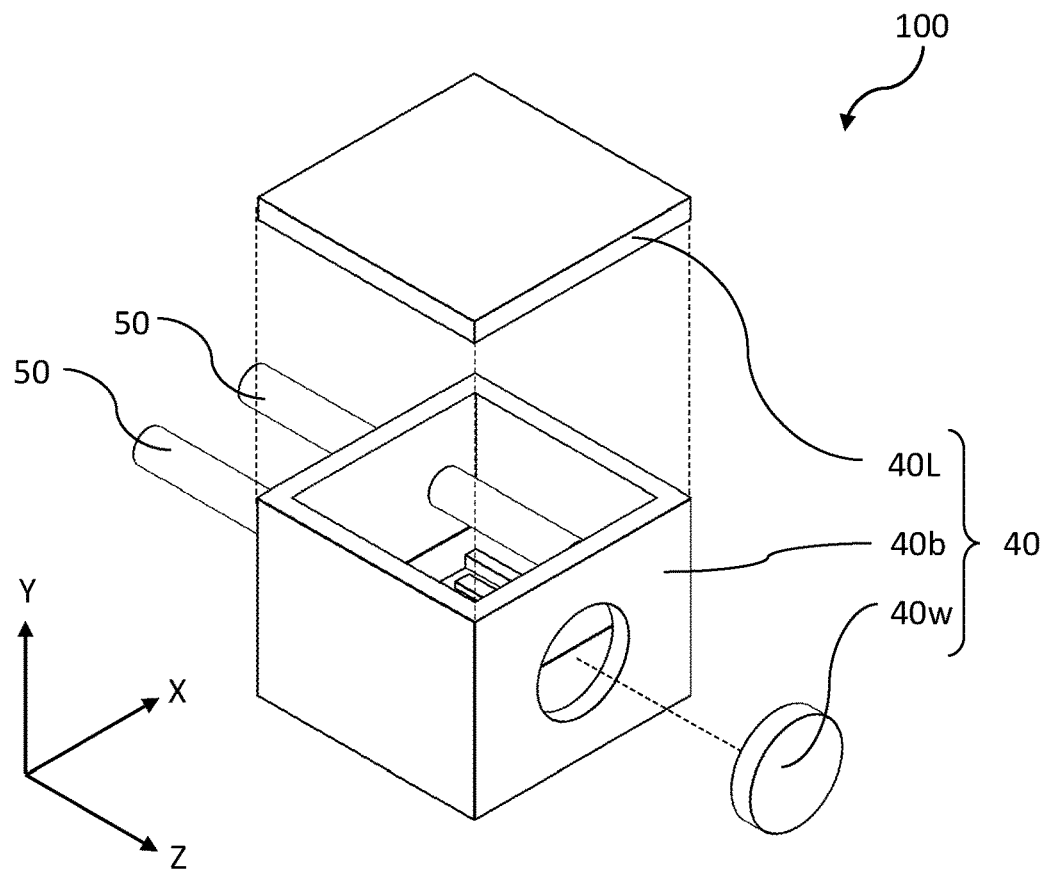
FIG. 1A is a perspective view schematically showing an example of a configuration of a laser light source according to A first embodiment of the present disclosure.

Hereinafter, with reference to the drawings, laser light sources according to certain embodiments of the present disclosure will be described in detail. The same reference characters in a plurality of drawings denote the same or similar parts.

Moreover, the description below is intended to give a concrete form to the technical ideas of the present disclosure, but the scope of the present disclosure is not intended to be limited thereto. The size, material, shape, relative arrangement, etc., of the components are intended as examples, and the scope of the present disclosure is not intended to be limited thereto. The size, arrangement relationship, etc., of the members shown in each drawing may be exaggerated in order to facilitate understanding.

First Embodiment

First, with reference to FIG. 1A to FIG. 2C, an example of a configuration of a laser light source according to a first embodiment of the present disclosure will be described.

FIG. 1A is a perspective view schematically showing an example of a configuration of a laser light source 100 according to the first embodiment of the present disclosure. FIG. 13 is a diagram schematically showing a planar configuration of the laser light source 100 in FIG. 1A. The laser light source 100 of the present embodiment includes a laser diode chip 10, a submount 20 supporting the laser diode chip 10, a collimating lens 30 supported by the submount 20, and a semiconductor laser package 40 housing these elements and components. Moreover, the laser light source 100 of the present embodiment includes a pair of lead terminals 50 that penetrate the semiconductor laser package 40 and that supply power to the laser diode chip 10. The semiconductor laser package 40 includes a cover 40L, base 40b, and a light-transmitting window 40w. In the laser light source 100 of the present embodiment, laser light that has been emitted from the laser diode chip 10 and collimated by the collimating lens 30 is extracted to the outside through the light-transmitting window 40w.

Although the cover 40L, the base 40b, and the light-transmitting window 40w of the semiconductor laser package 40 are shown isolated in FIG. 1A for ease of understanding, they are actually bonded to one another. In FIG. 13, the cover 40L of the semiconductor laser package 40 is omitted from illustration.

In the figures, an X axis, a Y axis, and a Z axis that are orthogonal to one another are schematically shown for reference. For ease of understanding, in the present disclosure, a side at which the laser diode chip 10, the submount 20, and the collimating lens 30 are located in the base 40b may be indicated as an "upper side." This does not restrict the orientation of the laser light source 100 in use; rather, the laser light source 100 may be oriented in any appropriate direction.

Figure 2A:
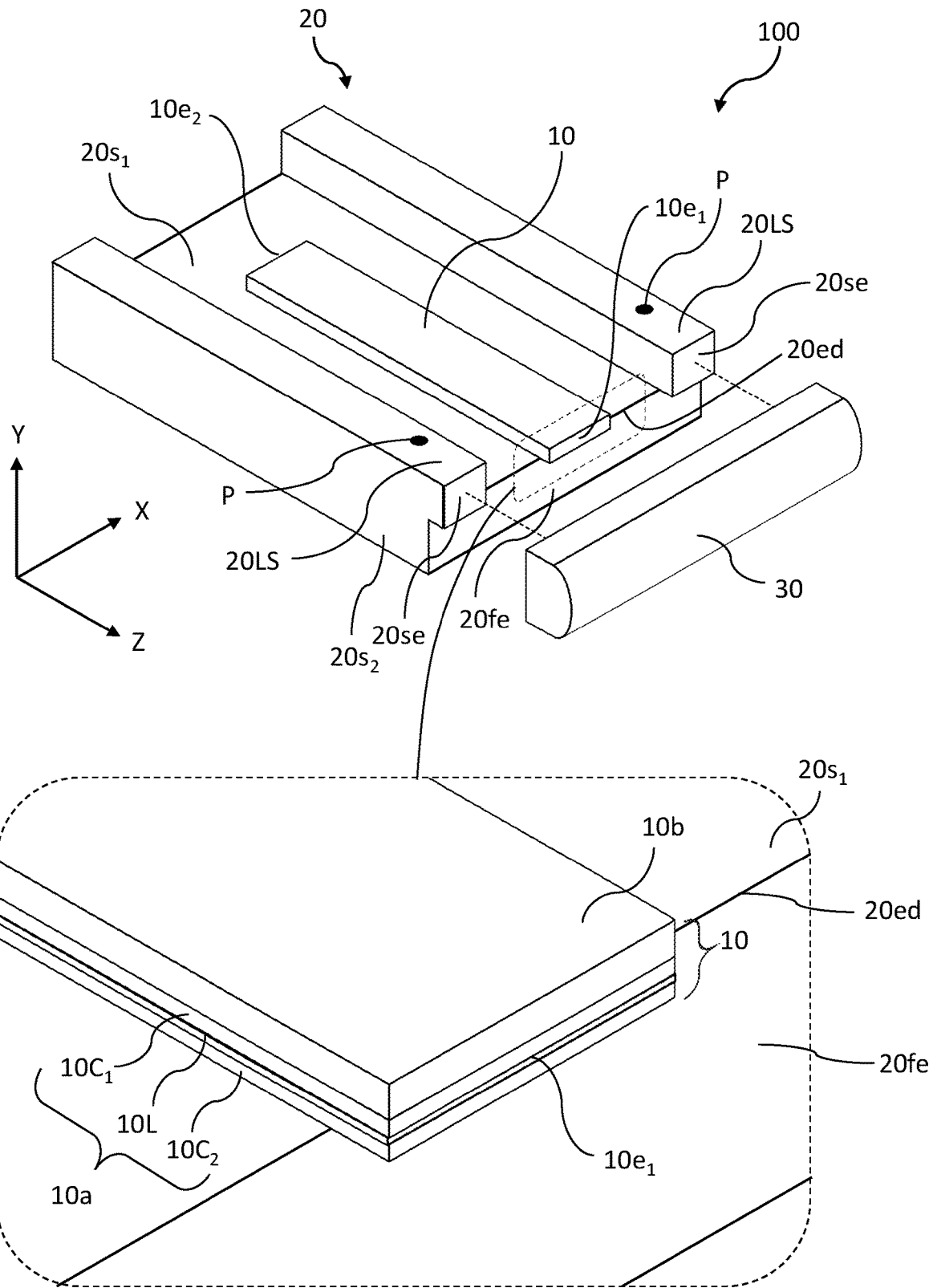
FIG. 2A is a perspective view schematically showing in more detail the configuration of the laser light source in FIG. 1A, in which the semiconductor laser package and the pair of lead terminals are not shown.
Figure 2B:
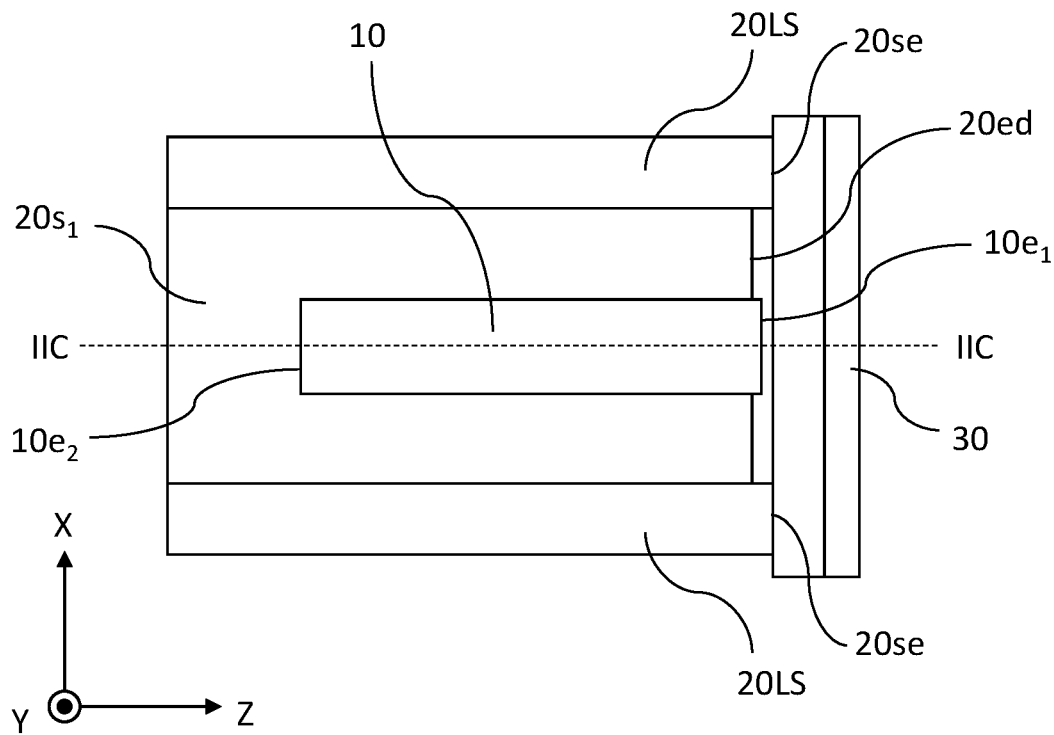
FIG. 2B is a top plan view schematically showing the laser light source in FIG. 2A.
Figure 2C:
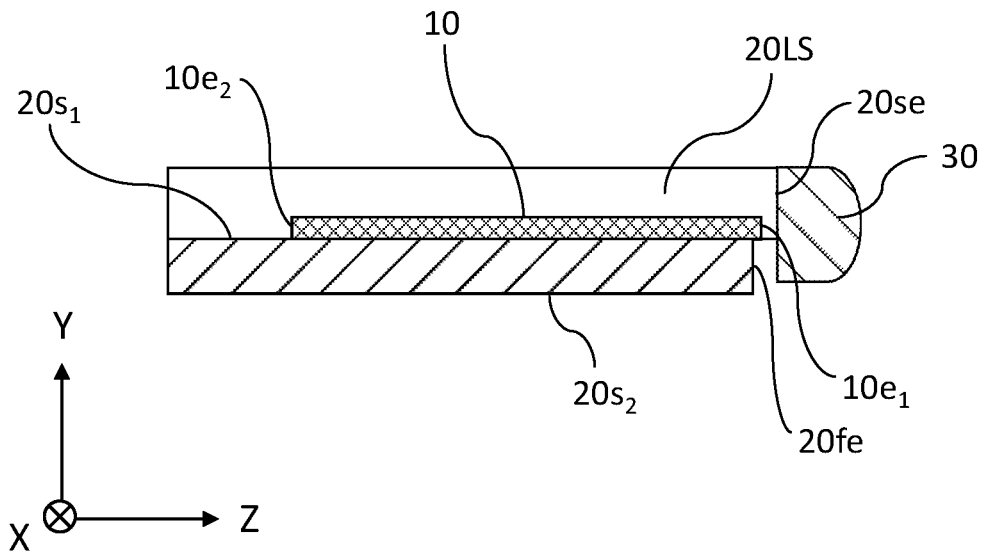
FIG. 2C is a schematic cross-sectional view of the configuration of FIG. 2B taken along line IIC-IIC, which is parallel to the YZ plane.

FIG. 2A is a schematic perspective view showing in more detail the configuration of the laser light source 100 in FIG. 1A, in which illustration of the semiconductor laser package 40 and the pair of lead terminals 50 are omitted. The region surrounded by a broken line in FIG. 2A shows an example of a more detailed structure of the laser diode chip 10 being disposed in the submount 20. Although the submount 20 and the collimating lens 30 are shown isolated in FIG. 2A, they are actually bonded to each other. FIG. 2B is a top plan view schematically showing the laser light source 100 in FIG. 2A. FIG. 2C is a schematic cross-sectional view of the configuration of FIG. 2B taken along line IIC-IIC, which is parallel to the YZ plane. In the present disclosure, a side at which the collimating lens 30 is located with respect to the submount 20 may be referred to as the "front."

As shown in FIG. 2A, the laser diode chip 10 is an edge-emitting type laser diode including: a semiconductor multilayer structure 10a that includes a first cladding layer $10C_1$, a second cladding layer $10C_2$, and an emission layer 10L; a substrate 10b supporting the semiconductor multilayer structure 10a; an emission end surface $10e_1$ through which the high-power laser light that has been generated in the emission layer 10L is emitted; and a rear surface $10e_2$ opposite to the emission end surface $10e_1$. The emission layer 10L is located between the first cladding layer $10C_1$ and the second cladding layer $10C_2$. The laser diode chip 10 may further include other layers, such as a buffer layer and a contact layer.

The laser diode chip 10 is fixed to the submount 20 in a face-down state, i.e., so that the emission layer 10L is closer to the submount 20 than the substrate 10b. The total size of the semiconductor multilayer structure 10a and the substrate 10b of the laser diode chip 10 along the Y direction is about 80 μm. The total size of the substrate 10b and the first cladding layer $10C_1$ along the Y direction is greater than the size of the second cladding layer $10C_2$ along the Y direction. In a face-down state, the distance between the emission layer 10L and the submount 20 is about 1/10 of this distance in a face-up state (in which the emission layer 10L would be farther from the submount 20 than the substrate 10b). Therefore, in a face-down state, even if high-power laser light is emitted from the emission layer 10L, heat generated in the emission layer 10L can be efficiently transmitted to the submount 20. The output power of laser light according to the present embodiment is e.g. 3 W or greater and 50 W or less.

The semiconductor multilayer structure 10a may have a double-hetero structure to generate an energy level of a quantum well, for example. The emission layer 10L has a band gap that is smaller than the band gaps of the first cladding layer $10C_1$ and the second cladding layer $10C_2$. In the present embodiment, the substrate 10b and the first cladding layer $10C_1$ on the substrate 10b may each be composed of an n type semiconductor. The emission layer 10L may be composed of an intrinsic semiconductor, an n type semiconductor, or a p type semiconductor, and the second cladding layer $10C_2$ on the emission layer 10L may be composed of a p type semiconductor. The n type and the p type may be reversed. When an electric current is injected from the p type cladding layer to the n type cladding layer, a population inversion of carriers occurs in the emission layer 10L, resulting in a stimulated emission of light from the emission layer 10L. The refractive index of the emission layer 10L is designed to be higher than those of the first cladding layer $10C_1$ and the second cladding layer $10C_2$, so that light generated in the emission layer 10L is confined within the emission layer 10L via total reflection. The emission layer 10L functions as a cavity, so that laser light is emitted from the emission end surface $10e_1$ of the emission layer 10L. The cavity length of the emission layer 10L is defined by the distance from the emission end surface $10e_1$ to the rear surface $10e_2$. The direction of the cavity length is parallel to the Z direction. The cavity length is e.g. not less than 500 μm and not more than 5000 μm. Increase in the cavity length allows increase in the contact area between the laser diode chip 10 and the submount 20, so that the heat generated in the emission layer 10L can be efficiently transmitted to the submount 20.

When the laser light emitted from the emission end surface $10e_1$ of the laser diode chip 10 propagates, it diverges fast in the YZ plane and slow in the XZ plane. When not being collimated, the laser light creates a spot having an elliptical shape in the far field, such that the elliptical shape has a major axis along the Y direction and a minor axis along the X direction, in the XY plane.

The laser diode chip 10 is configured to emit laser light of violet, blue, green, or red in the visible light region, or infrared or ultraviolet laser light. The emission peak wavelength of violet light is preferably 350 nm or greater and 419 nm or less, and more preferably 400 nm or greater and 415 nm or less. The emission peak wavelength of blue light is preferably 420 nm or greater and 494 nm or less, and more preferably 440 nm or greater and 475 nm or less. Examples of a semiconductor laser device configured to emit violet or blue laser light include a semiconductor laser device containing a nitride semiconductor. Examples of nitride semiconductors include GaN, InGaN, and AlGaN. The emission peak wavelength of green light is preferably 495 nm or greater and 570 nm or less, and more preferably 510 nm or greater and 550 nm or less. Examples of a semiconductor laser device configured to emit green laser light include a semiconductor laser device containing a nitride semiconductor. Examples of nitride semiconductors include GaN, InGaN, and AlGaN. The emission peak wavelength of red light is preferably 605 nm or greater and 750 nm or less, and more preferably 610 nm or greater and 700 nm or less. Examples of a semiconductor laser device configured to emit red laser light include a semiconductor laser device containing an InAlGaP-based, GaInP-based, GaAs-based, or AlGaAs-based semiconductor. For a semiconductor laser device configured to emit red light, a semiconductor laser device having two or more waveguide regions may be used.

Semiconductor laser devices containing such semiconductors are more prone to a decrease in the output associated with heat than semiconductor laser devices containing nitride semiconductors. Increase of waveguide regions allows for dispersing heat, so that decrease in the output of the semiconductor laser device can be reduced.

The submount 20 includes: a principal surface $20s_1$ on which the laser diode chip 10 is fixed; a pair of lens supports 20LS each including an end surface 20se, with the end surfaces 20se located at opposite sides to each other with respect to the emission end surface $10e_1$ of the laser diode chip 10; a back surface $20s_2$ opposite to the principal surface $20s_1$; and a front end surface 20fe connecting the principal surface $20s_1$ and the back surface $20s_2$. The principal surface $20s_1$ and the front end surface 20fe define an edge 20ed of the principal surface $20s_1$. In the example shown in FIG. 2A, the pair of lens supports 20LS are a pair of protrusions being located on opposite sides with respect to the laser diode chip 10 and extending along the Z direction. In any portion behind the front end surface 20fe, the submount 20 has a U-shape in a cross section perpendicular to the Z direction; this U-shape is created by dividing, along a plane parallel to the XZ plane, a prismatic body that is mirror-symmetric with respect to a plane parallel to the YZ plane and that extends along the Z direction. End surfaces 20se of the pair of lens supports 20LS are located outward in a direction along the cavity length direction with respect to the emission end surface $10e_1$ of the laser diode chip 10. The normal direction of the principal surface $20s_1$ is parallel to the Y direction.

The distance between the end surface 20se of each of the pair of lens supports 20LS and the emission end surface $10e_1$ of the laser diode chip 10 along the Z direction may be designed to be substantially equal to the focal length of the collimating lens 30. The distance between the end surface 20se of each of the pair of lens supports 20LS and the emission end surface $10e_1$ of the laser diode chip 10 along the Z direction is e.g. 50 μm or greater and 100 μm or less. The size of each of the pair of lens supports 20LS along the Y direction may be approximately the same as the size of the collimating lens 30 along the Y direction; the size of each of the pair of lens supports 20LS along the Y direction may be greater than, equal to, or smaller than the size of the collimating lens 30 along the Y direction. The size of each of the pair of lens supports 20LS along the Y direction is e.g. 100 μm or greater and 500 μm or less.

The size of the submount 20 along the X direction is e.g. 1 mm or greater and 3 mm or less, and the size of a portion of the submount 20 other than the pair of lens supports 20LS along the Y direction is e.g. 100 μm or greater and 500 μm or less, and the size of a portion of the submount other than the pair of lens supports 20LS along the Z direction is e.g. 1 mm or greater and 6 mm or less. In the present disclosure, the maximum in these ranges of sizes may be determined in view of reduction in size of the laser light source 100.

In the submount 20, the emission end surface $10e_1$ of the laser diode chip 10 protrudes with respect to the edge 20ed of the principal surface $20s_1$ along the cavity length direction. The distance between the emission end surface $10e_1$ of the laser diode chip 10 and the edge 20ed of the principal surface $20s_1$ along the Z direction is e.g. 2 μm or greater and 50 μm or less. With this arrangement, even if the laser diode chip 10 and the principal surface $20s_1$ of the submount 20 are fixed by a bonding member of an inorganic material such as AuSn in a face-down state, for example, climb-up of the bonding member onto the emission end surface $10e_1$ of the emission layer 10L can be reduced. In the laser light source disclosed in Japanese Patent Publication No. 2000-98190, when the laser diode chip is disposed in a face-down state, the bonding member that bonds the laser diode chip and the submount together may possibly climb onto the emission end surface $10e_1$ of the emission layer of the laser diode chip, which may result in the output power of the laser light that is emitted from the laser diode chip. In the laser light source 100 of the present embodiment, however, such a decrease in the output power of laser light can be reduced.

A portion or a whole of the submount 20 may be made of a ceramic containing at least one selected from the group consisting of AlN, SiC, and aluminum oxide or an alloy such as CuW, for example. The submount 20 can be provided by sintering a powder of ceramic, for example. The thermal conductivity of the ceramic may be e.g. 10 [W/m·K] or greater and 500 [W/m·K] or less. In order to reduce deformation due to the heat that is applied when fixing the laser diode chip 10, the ceramic may have a low coefficient of thermal expansion. The coefficient of thermal expansion may be $2\times10^{-6}$ [1/K] or greater and $1\times10^{-5}$ [1/K] or less. On each of the principal surface $20s_1$ and the back surface $20s_2$ of the submount 20, a metal film having a thickness of e.g. 0.5 μm or greater and 10 μm or less may be formed. The principal surface $20s_1$ and the back surface $20s_2$ of the submount 20 may each be plated with Au, for example. With the metal film disposed on the principal surface $20s_1$, the laser diode chip can be bonded to the principal surface $20s_1$ via, for example, AuSn. With the metal film disposed on the back surface $20s_2$, the submount 20 can be bonded to a bottom 40b1 via, for example, AuSn.

The collimating lens 30 is a so-called FAC (Fast Axis Collimator) lens which collimates, within the laser light emitted from the laser diode chip 10, components of the laser light that diverge significantly in the YZ plane. Optionally, a so-called SAC (Slow Axis Collimator) lens (not shown) that collimates, within the laser light, components that diverge to a lesser extent in the XZ plane may be disposed outside the laser light source 100. In the present disclosure, to "collimate" means not only converting laser light into parallel light, but also reducing the divergence angle of the laser light. Depending on the application, other lenses such as a converging lens may be used instead of the collimating lens 30.

The collimating lens 30 is a cylindrical lens having a structure elongated along the X direction, and has no or little curvature along the X direction and a curvature along the Y direction. The direction in which the collimating lens 30 extends is a direction that is perpendicular to both the normal direction of the principal surface $20s_1$ of the submount 20 and the cavity length direction. With the approximately same size of the collimating lens 30 and the pair of lens supports 20LS along the Y direction, it is easy to dispose the collimating lens 30 such that the centroid of the collimating lens 30 is located between the pair of lens supports 20LS when viewed in the cavity length direction. Based on this relative positioning of the centroid of the collimating lens 30, the collimating lens 30 can be stably disposed on the submount 20 with an improved accuracy.

In the present embodiment, with respect to the back surface $20s_2$ of the submount 20, the height of the upper surface of each of the pair of lens supports 20LS along the Y direction is substantially equal to the height of the upper surface of the collimating lens 30 along the Y direction. More specifically, the position of the collimating lens 30 relative to the pair of lens supports 20LS is coarsely adjusted so that the above two heights are substantially equal; thereafter, while laser light is allowed to be emitted from the laser diode chip 10, the position of the collimating lens 30 relative to the pair of lens supports 20LS is finely adjusted so that the laser light is appropriately collimated. The heights of the upper surfaces of the pair of lens supports 20LS and the upper surface of the collimating lens 30 along the Y direction are not necessarily substantially equal, but may be different from each other.

In the present embodiment, the collimating lens 30 is uniform along the X direction, and therefore the alignment between the emission end surface $10e_1$ of the laser diode chip 10 and the collimating lens 30 along the X direction does not need to be taken into consideration. It is sufficient that, in the collimating lens 30, at least a portion (a "facing portion") facing the emission end surface $10e_1$ of the laser diode chip 10 and a peripheral portion near the facing portion are uniform along the X direction. Therefore, the remainders, i.e., side portions, do not need to be uniform along the X direction, and do not even need to be transparent. The size of each side portion of the collimating lens 30 along the Y direction may be greater than, equal to, or smaller than the size of the opposing portion and its periphery along the Y direction. The collimating lens 30 may be made of at least one selected from the group consisting of glass, quartz, synthetic quartz, sapphire, transparent ceramics, and plastics, for example.

The collimating lens 30 is bonded to the end surfaces 20se of the pair of lens supports 20LS in a direction along the Z direction. Even if there is a slight variation in the thickness of a bonding member that bonds together the collimating lens 30 and the end surfaces 20se of the pair of lens supports 20LS, such variation hardly affects the position of the collimating lens 30 along the Y direction. There may be a configuration in which a pedestal having a surface parallel to the principal surface $20s_1$ is disposed in front of the submount 20 and the collimating lens 30 is disposed on the surface of the pedestal, which is different from a configuration in the present embodiment. However, in such a configuration, if variation occurs in the thickness of the bonding member between the collimating lens 30 and the surface of the pedestal, a misalignment along the Y direction may occur between the laser diode chip 10 and the collimating lens 30, so that the optical axis of the laser light that is emitted from the laser light source 100 to the outside may possibly be greatly misoriented. On the other hand, in the present embodiment, misalignments between the laser diode chip 10 and the collimating lens 30 along the Y direction are less likely to occur, and the optical axis of the laser light that is emitted from the laser light source 100 to the outside can be oriented in a direction as designed. In the present embodiment, even if a slight variation occurs in the thickness of the bonding member, such variation in thickness of the bonding member result in merely a slight deviation in the position of the collimating lens 30 along the optical axis of the laser light, which hardly affect the orientation of the optical axis of the laser light.

The collimating lens 30 and the end surfaces 20se of the pair of lens supports 20LS may be bonded by a bonding member of an inorganic material such as AuSn. Metal films may be disposed on the bonding surface of the collimating lens 30 and the end surfaces 20se of the pair of lens supports 20LS. Such metal films allows, for example, bonding with AuSn. The bonding temperature for AuSn is about 280° C. Given that the ceramic composing the submount 20 has a low thermal conductivity, the influences of heat, applied to the bonding member during bonding of the end surfaces 20se of the pair of lens supports 20LS and the collimating lens 30, on the laser diode chip 10 can be reduced.

In another example, the collimating lens 30 and the end surfaces 20se of the pair of lens supports 20LS may be bonded together with a bonding member containing a thermosetting resin. The bonding temperature for thermosetting resins is about 100° C., which is lower than the bonding temperature for inorganic materials.

Therefore, the influences of heat, applied to the bonding member during bonding of the end surfaces 20se of the pair of lens supports 20LS and the collimating lens 30, on the laser diode chip 10 can be further reduced. During bonding between the collimating lens 30 and the end surfaces 20se of the pair of lens supports 20LS, the thermosetting resin may be heated by irradiating the position indicated by a point P shown in FIG. 2A with laser light, for example. The distance between the position of point P and each of the end surfaces 20se of the pair of lens supports 20LS along the Z direction is e.g. 50 μm or greater and 500 μm or less. In the present embodiment, in a top plan view, the optical axis of the laser light emitted from the laser diode chip 10 and the bonding member do not overlap each other; therefore, even if an out-gas is generated from the bonding member containing a thermosetting resin, the out-gas can be restrained from approaching toward the laser diode chip 10. This can reduce occurrence of dust attraction (described later) at the emission end surface $10e_1$ of the laser diode chip 10.

Some inorganic material-based bonding members may contain organic matter as a binder. Using such bonding members to effect the bonding between the collimating lens 30 and the end surfaces 20se of the pair of lens supports 20LS can also restrain the out-gas, generated by heating, from approaching the laser diode chip 10.

In the laser light source 100 of the present embodiment, the submount 20 supports the laser diode chip 10 and the collimating lens 30. With the reduced distance between the emission end surface $10e_1$ of the laser diode chip and the collimating lens 30, divergence of laser light emitted from the laser diode chip 10 can be reduced with the small collimating lens 30 instead of greatly diverging. This allows for obtaining the laser light source 100 of a small size. Also, the diameter of a collimated beam passing through the collimating lens 30 can be reduced.

The semiconductor laser package 40 may hermetically seal the laser diode chip 10, the submount 20, and the collimating lens 30. When the laser diode chip 10 emits laser light of a short wavelength, e.g., 350 nm or greater and 570 nm or less, organic gas components and the like that are contained in the ambient may be decomposed by the laser light, so that the decomposed matter may adhere to the emission end surface $10e_1$ of the laser diode chip 10. Moreover, if the emission end surface $10e_1$ of the laser diode chip 10 is in contact with the outside air, deterioration of the emission end surface $10e_1$ may progress during operation due to dust attraction or the like. Such deterioration of the emission end surface $10e_1$ may lead to decrease in the optical output of the laser diode chip 10. In order to enhance the reliability of the laser diode chip 10 for extending the operation life, it is preferable that the semiconductor laser package 40 seals the laser diode chip 10 hermetically. Hermetically sealing by the semiconductor laser package 40 may be achieved regardless of the wavelength of the laser light to be emitted from the laser diode chip 10.

Figure 1B:
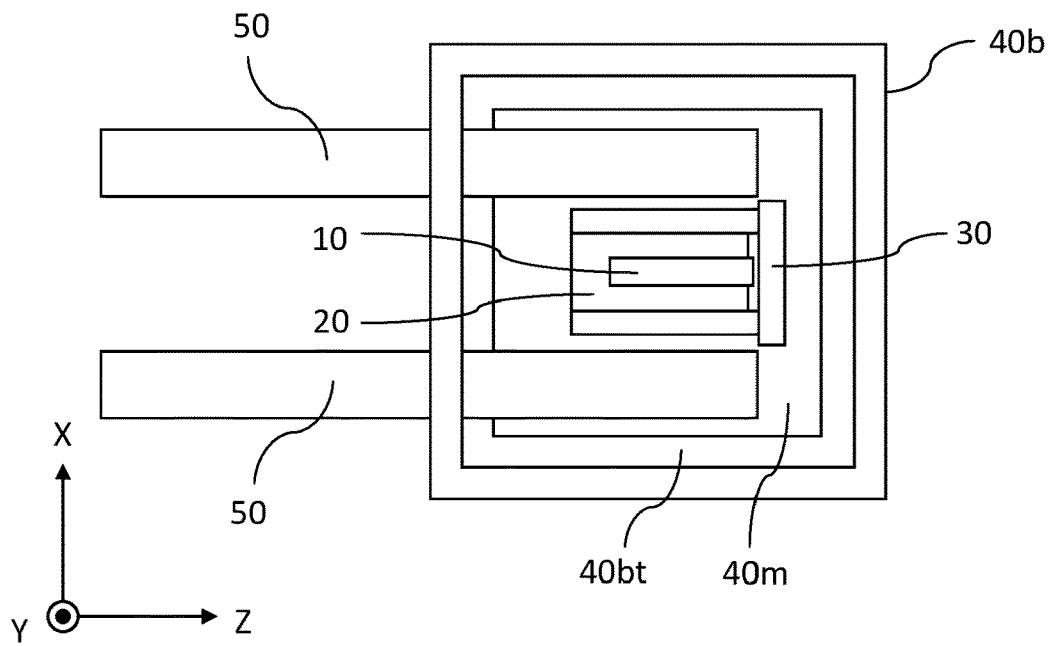
FIG. 1B is a diagram schematically showing a planar configuration of the laser light source in FIG. 1A.

The base 40b of the semiconductor laser package 40 is thermally in contact with the back surface $20s_2$ of the submount 20. The base 40b may be made of a material of high thermal conductivity. For example, at least one selected from the group consisting of Cu, Al, Ag, Fe, Ni, Mo, Cu, W, and CuMo, can be used for a material of the base 40b. In order to align the emission end surface $10e_1$ of the laser diode chip 10 and the light-transmitting window 40w in height, a member 40m of high thermal conductivity may be disposed between a bottom surface 40bt of the base 40b and the submount 20, as shown in FIG. 1B. The member 40*m* may be made of the same material as that of the portion of the base 40*b* including the bottom surface 40*bt*. Alternatively, at least a portion of the bottom surface 40*bt* of the base 40*b* may project upward, and the submount 20 may be disposed on this projecting portion of the bottom surface 40*bt*. The portion of the base 40*b* including the bottom surface 40*bt* may be made of copper, for example. The portion of the base 40*b* that surrounds the laser diode chip 10, the submount 20, and the collimating lens 30 may be made of kovar, for example. Kovar is an alloy in which nickel and cobalt are added to iron, which is a main component. The cover 40L of the semiconductor laser package 40 may be made of the same material as, or a different material from, that of the base 40*b*. The light-transmitting window 40*w* of the semiconductor laser package 40, which is mounted on the base 40*b*, transmits the laser light emitted from the laser diode chip 10. Similar to the collimating lens 30, the light-transmitting window 40*w* of the semiconductor laser package 40 can be made of at least one selected from the group consisting of glass, quartz, synthetic quartz, sapphire, transparent ceramics, and plastics, for example.

Each of the pair of lead terminals 50 is electrically connected to the laser diode chip 10 via a respective one of wires as described below. In the example shown in FIG. 2A, a metal film is disposed on the upper surface of the laser diode chip 10, and is electrically connected to one of the pair of lead terminals 50 via a corresponding wire. Similarly, a metal film is also disposed on the principal surface $20s_1$ of the submount 20, and is electrically connected to the other one of the pair of lead terminals 50 via a wire. For example, the upper surface of the laser diode chip 10 and the principal surface $20s_1$ of the submount 20 may be plated with Au. Via the pair of lead terminals 50, an electric current is injected from the second cladding layer $10C_2$ to the first cladding layer $10C_1$ of the laser diode chip 10. The lead terminals 50 are electrically connected to an external circuit (not shown) that adjusts the emission timing and the output power of laser light to be emitted from the laser diode chip 10. The lead terminals 50 are made of a material having good electrical conduction. Examples of such materials include Fe—Ni alloys, Cu alloys, and other metals.

In the laser light source 100 of the present embodiment, the submount 20 supports the laser diode chip 10 on the principal surface $20s_1$ between the pair of lens supports 20LS, and supports the collimating lens 30 with the end surfaces 20*se* of the pair of lens supports 20LS. This allows for facilitating alignment between the laser diode chip 10 and the collimating lens 30 as described above, and the laser light source 100 of a small size can be obtained. Furthermore, in the laser light source 100 of the present embodiment, even when the laser diode chip 10 is disposed on the submount 20 in a face-down state, climbing-up of the bonding member onto the emission end surface $10e_1$ of the laser diode chip 10 can be reduced.

Modified Examples of First Embodiment

Next, Modified Examples 1 to 7 of the laser light source 100 according to the first embodiment of the present disclosure will be described. In the Modified Examples described below, the semiconductor laser package 40 and the pair of lead terminals 50 will be omitted from illustration. Descriptions repetitive of the description above may be omitted.

Figure 3B:
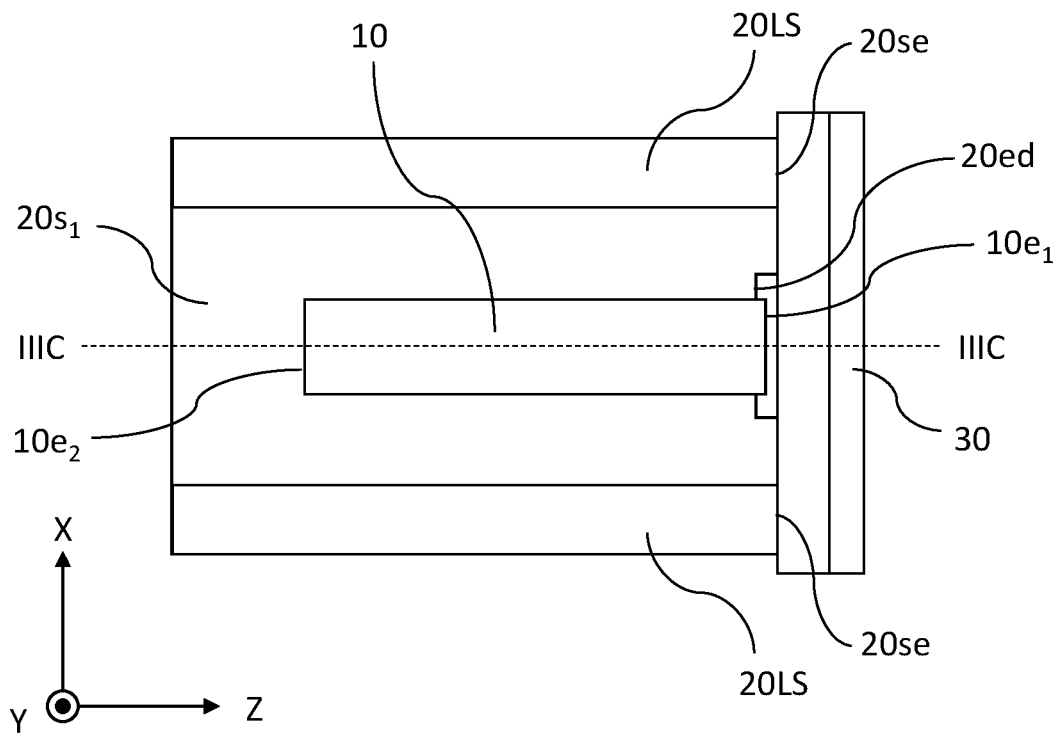
FIG. 3B is a top plan view schematically showing the laser light source in FIG. 3A.
Figure 3C:
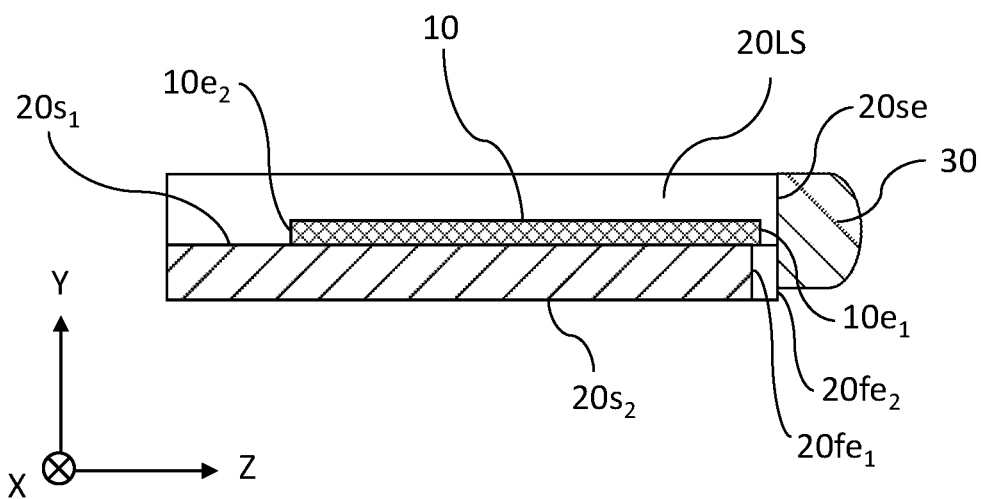
FIG. 3C is a schematic cross-sectional view of the configuration of FIG. 3B taken along line IIIC-IIIC, which is parallel to the YZ plane.

With reference to FIG. 3A to FIG. 3C, an example of a configuration of a laser light source 110 according to Modified Example 1 of the first embodiment of the present disclosure will be described. FIG. 3A is a perspective view schematically showing an example of a configuration of the laser light source 110 according to Modified Example 1 of the first embodiment of the present disclosure. FIG. 3B is a top plan view schematically showing the laser light source 110 in FIG. 3A. FIG. 3C is a cross-sectional view of the configuration of FIG. 3B taken along line IIIC-IIIC, which is parallel to the YZ plane. The laser light source 110 according to Modified Example 1 of the first embodiment differs from the laser light source 100 according to the first embodiment in the shape of the submount 20. The front end surface 20*fe* of the submount 20 includes a central end surface $20fe_1$, and side end surfaces $20fe_2$ located on opposite sides of the central end surface $20fe_1$. The central end surface $20fe_1$ is recessed with respect to the side end surfaces $20fe_2$ in a direction along the cavity length direction. The edge 20*ed* of the principal surface $20s_1$ according to Modified Example 1 of the first embodiment is defined by the principal surface $20s_1$ and the central end surface $20fe_1$. The recess defined by the central end surface $20fe_1$ has a size along the Z direction of e.g. 5 μm or greater and 100 μm or less, a size along the X direction of e.g. 50 μm or greater and 200 μm or less, and the size along the Y direction below the principal surface $20s_1$ of e.g. 100 μm or greater and 500 μm or less. The recess does not need to penetrate throughout the Y direction.

The emission end surface $10e_1$ of the laser diode chip 10 protrudes in a direction along the cavity length direction with respect to the edge 20*ed* of the principal surface $20s_1$, which is defined by the principal surface $20s_1$ and the central end surface $20fe_1$. Similar to the end surfaces 20*se* of the pair of lens supports 20LS, the side end surfaces $20fe_2$ of the submount 20 protrude with respect to the emission end surface $10e_1$ of the laser diode chip 10 in a direction along the cavity length direction. With the edge 20*ed* of the principal surface $20s_1$ being defined by the principal surface $20s_1$ and the central end surface $20fe_1$, climbing-up of the bonding member onto the emission end surface $10e_1$ of the laser diode chip 10 can be reduced. The submount 20 according to Modified Example 1 of the first embodiment can be obtained by removing a portion in the front end surface 20*fe* of the submount 20 described above having the U shape in a plane perpendicular to the Z direction, and thus can be easily produced. Moreover, the collimating lens 30 is bonded to an L-shaped end surface containing the end surfaces 20*se* of the pair of lens supports 20LS and the side end surfaces $20fe_2$. This allows for increasing the contact area between the collimating lens 30 and the submount 20, which can facilitate bonding.

Figure 4B:
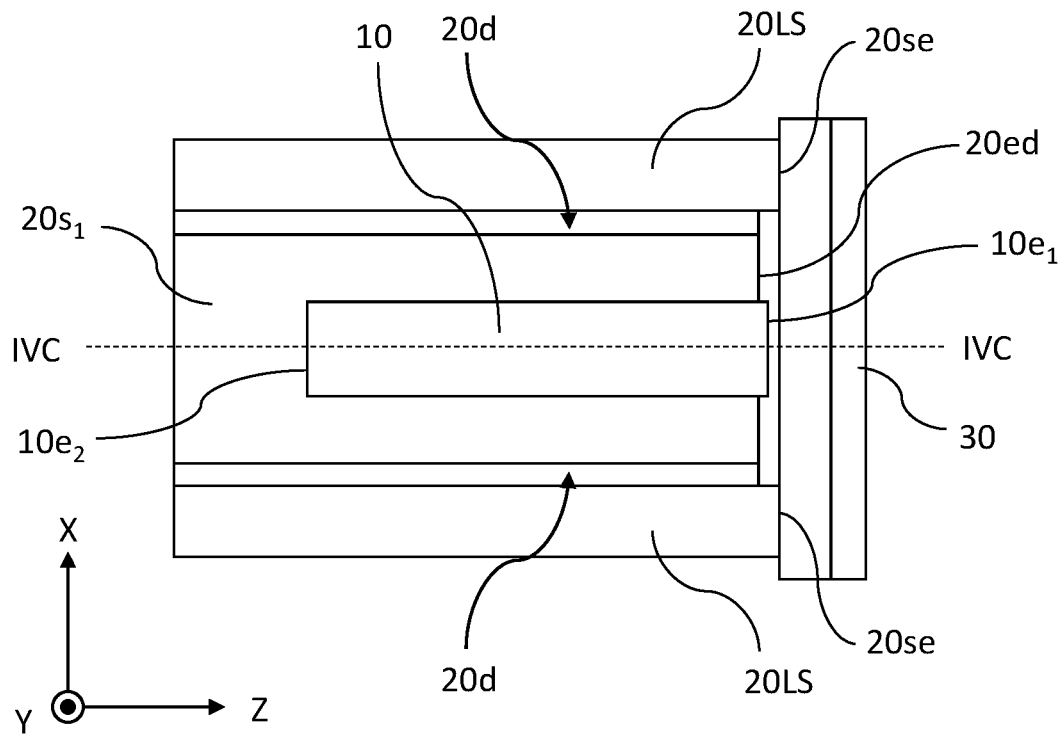
FIG. 4B is a top plan view schematically showing the laser light source in FIG. 4A.
Figure 4C:
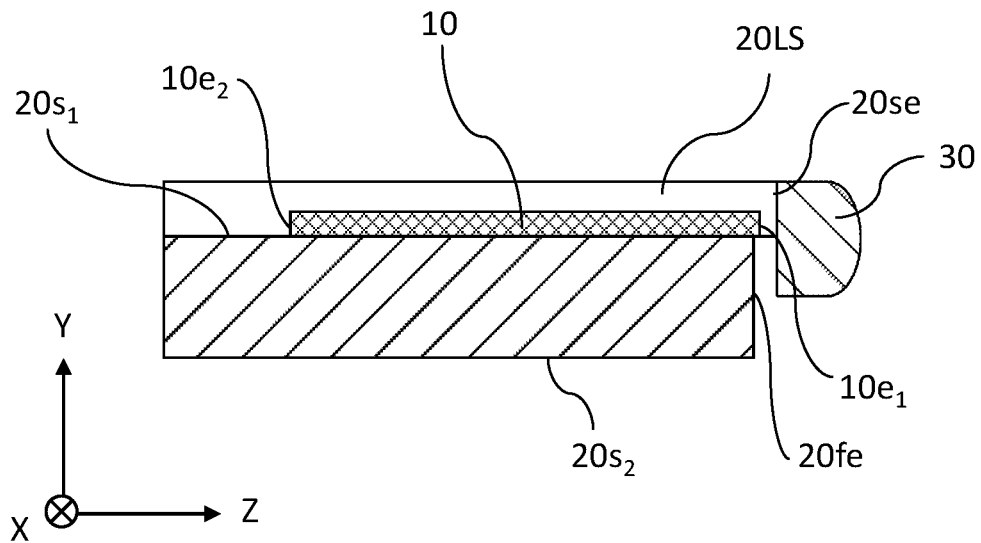
FIG. 4C is a schematic cross-sectional view of the configuration of FIG. 4B taken along line IVC-IVC, which is parallel to the YZ plane.

Next, with reference to FIG. 4A to FIG. 4C, an example of a configuration of a laser light source 120 according to Modified Example 2 of the first embodiment of the present disclosure will be described. FIG. 4A is a perspective view schematically showing an example of a configuration of the laser light source 120 according to Modified Example 2 of the first embodiment of the present disclosure. FIG. 4B is a top plan view schematically showing the laser light source 120 in FIG. 4A. FIG. 4C is a cross-sectional view of the configuration of FIG. 4B taken along line IVC-IVC, which is parallel to the YZ plane. The laser light source 120 according to Modified Example 2 of the first embodiment differs from the laser light source 100 according to the first embodiment in a shape of the submount 20. The submount 20 according to Modified Example 2 of the first embodiment has a groove 20*d* between each of the pair of lens supports 20LS and the laser diode chip 10, the grooves 20*d* extending along the cavity length direction. Although the example shown in FIG. 4B illustrates that the grooves 20*d* adjoin the pair of lens supports 20LS, the grooves 20*d* do not need to adjoin the pair of lens supports 20LS. Each groove 20*d* has a size along the X direction of e.g. 100 µm or greater and 500 µm or less, a size along the Y direction of e.g. 50 µm or greater and 300 µm or less, and a size along the Z direction below the edge 20*ed* of the principal surface $20s_1$ of e.g. 1 mm or greater and 6 mm or less. The grooves 20*d* do not need to penetrate throughout the Z direction. With the grooves 20*d*, influence of heat, applied to the bonding member during bonding of the end surfaces 20*se* of the pair of lens supports 20LS and the collimating lens 30, on the laser diode chip 10 can be reduced.

Figure 5A:
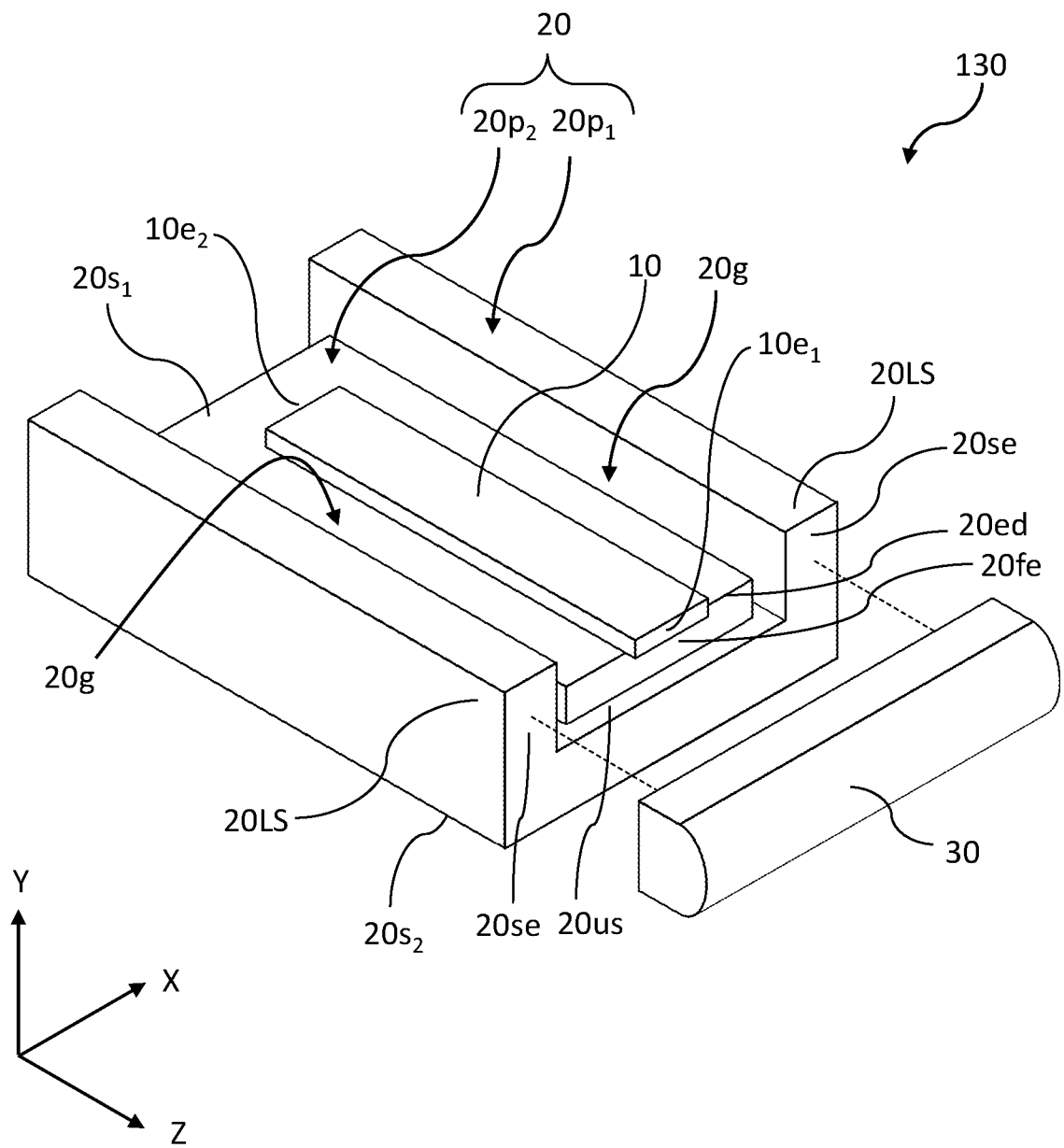
FIG. 5A is a perspective view schematically showing an example of a configuration of a laser light source according to Modified Example 3 of the first embodiment of the present disclosure.
Figure 5B:
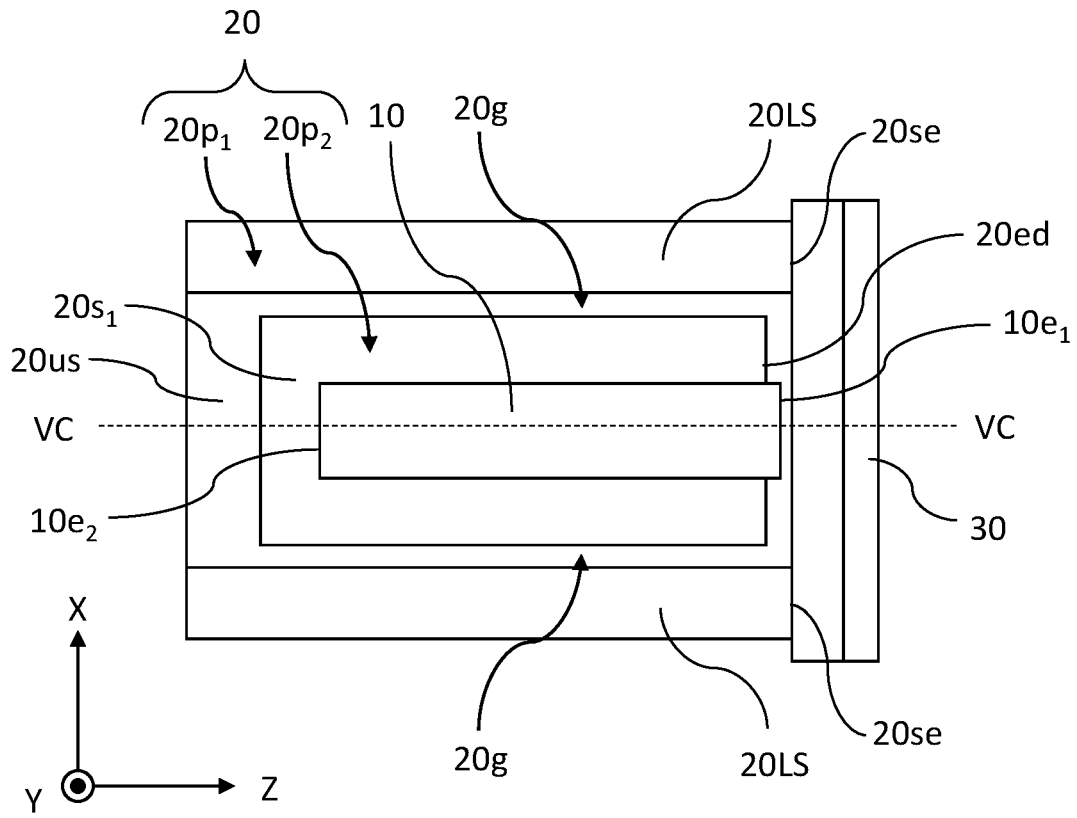
FIG. 5B is a top plan view schematically showing the laser light source in FIG. 5A.
Figure 5C:
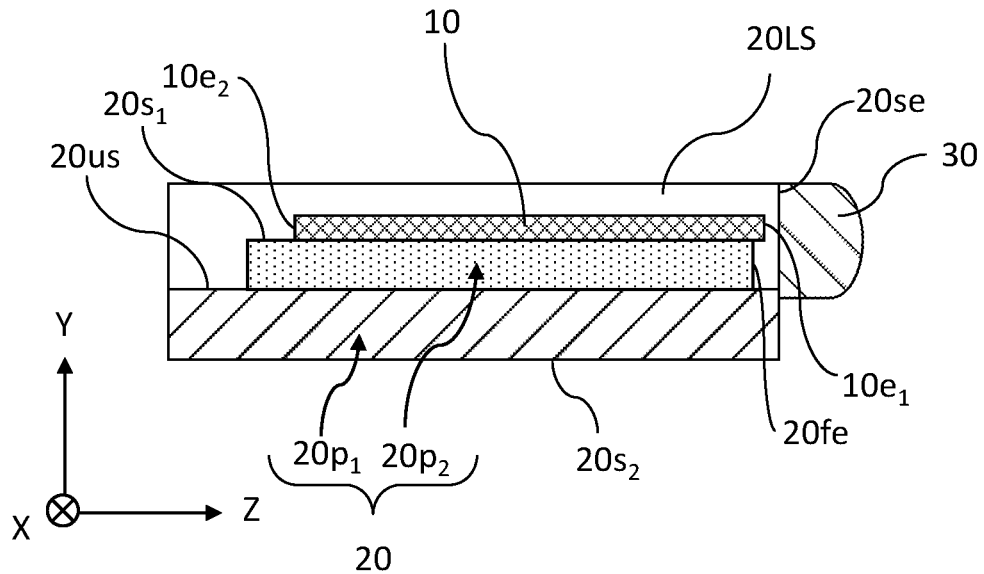
FIG. 5C is a schematic cross-sectional view of the configuration of FIG. 5B taken along line VC-VC, which is parallel to the YZ plane.

Next, with reference to FIG. 5A to FIG. 5C, an example of a configuration of a laser light source 130 according to Modified Example 3 of the first embodiment of the present disclosure will be described. FIG. 5A is a perspective view schematically showing an example of a configuration of the laser light source 130 according to Modified Example 3 of the first embodiment of the present disclosure. FIG. 5B is a top plan view schematically showing the laser light source 130 in FIG. 5A. FIG. 5C is a schematic cross-sectional view of the configuration of FIG. 5B taken along line VC-VC, which is parallel to the YZ plane. The laser light source 130 according to Modified Example 3 of the first embodiment differs from the laser light source 100 according to the first embodiment in the configuration of the submount 20. The submount 20 according to Modified Example 3 of the first embodiment includes a first submount portion $20p_1$ and a second submount portion $20p_2$. The first submount portion $20p_1$ includes a pair of lens supports 20LS on an upper surface 20*us*. The first submount portion $20p_1$ has the U shape in a plane perpendicular to the Z direction as described above. The first submount portion $20p_1$ may be made of a ceramic containing at least one selected from the group consisting of AlN, SiC, and aluminum oxide or an alloy such as CuW, for example. The second submount portion $20p_2$ is fixed on the upper surface 20*us* of the first submount portion $20p_1$, so as to be located between the pair of lens supports 20LS. The second submount portion $20p_2$ has a principal surface $20s_1$ on which the laser diode chip 10 is mounted, and a front end surface 20*fe* facing the collimating lens 30. The principal surface $20s_1$ is a surface of the second submount portion $20p_2$ that is opposite to a surface of the second submount portion $20p_2$ being fixed to the upper surface 20*us*. In the present disclosure, the front end surface 20*fe* and the back surface $20s_2$ do not need to be directly joined. In the present disclosure, one side of the front end surface 20*fe* abuts with one side of the principal surface $20s_1$, and this side along which the front end surface 20*fe* and the principal surface $20s_1$ abut each other defines the edge 20*ed* of the principal surface $20s_1$. When the thermal conductivity of the second submount portion $20p_2$ is higher than the thermal conductivity of the first submount portion $20p_1$, heat that is generated from the laser diode chip 10 can be efficiently transmitted to the outside. The second submount portion $20p_2$ may be made of at least one selected from the group consisting of Cu, Al, Ag, Fe, Ni, Mo, Cu, W, CuW, CuMo, AlN, SiC, and aluminum oxide, for example. The second submount portion $20p_2$ has a size along the X direction of e.g. 0.5 mm or greater and 1.5 mm or less, a size along the Y direction of e.g. 0.1 mm or greater and 0.5 mm or less, and a size along the Z direction of e.g. 1 mm or greater and 6 mm or less.

In the submount 20, the first submount portion $20p_1$ and the second submount portion $20p_2$ are separate pieces, so that the position of the second submount portion $20p_2$ can be adjusted on the first submount portion $20p_1$. As in this example, the submount 20 may include a part having the principal surface $20s_1$ and a part having the pair of lens supports 20LS, these parts being separate pieces. In the submount 20 of this example, an interspace 20*g* exists between each of the pair of lens supports 20LS and the second submount portion $20p_2$. The size of each interspace 20*g* along the X direction is e.g. 50 µm or greater and 300 µm or less. The sizes of each interspace 20*g* along the Y direction and the Z direction are determined by the sizes of the second submount portion $20p_2$ along the Y direction and the Z direction, respectively. With the interspaces 20*g*, influence of the heat, applied to the bonding member during bonding of the end surfaces 20*se* of the pair of lens supports 20LS and the collimating lens 30, on the laser diode chip 10 can be reduced as in the laser light source 120 according to Modified Example 2 of the first embodiment.

Figure 6A:
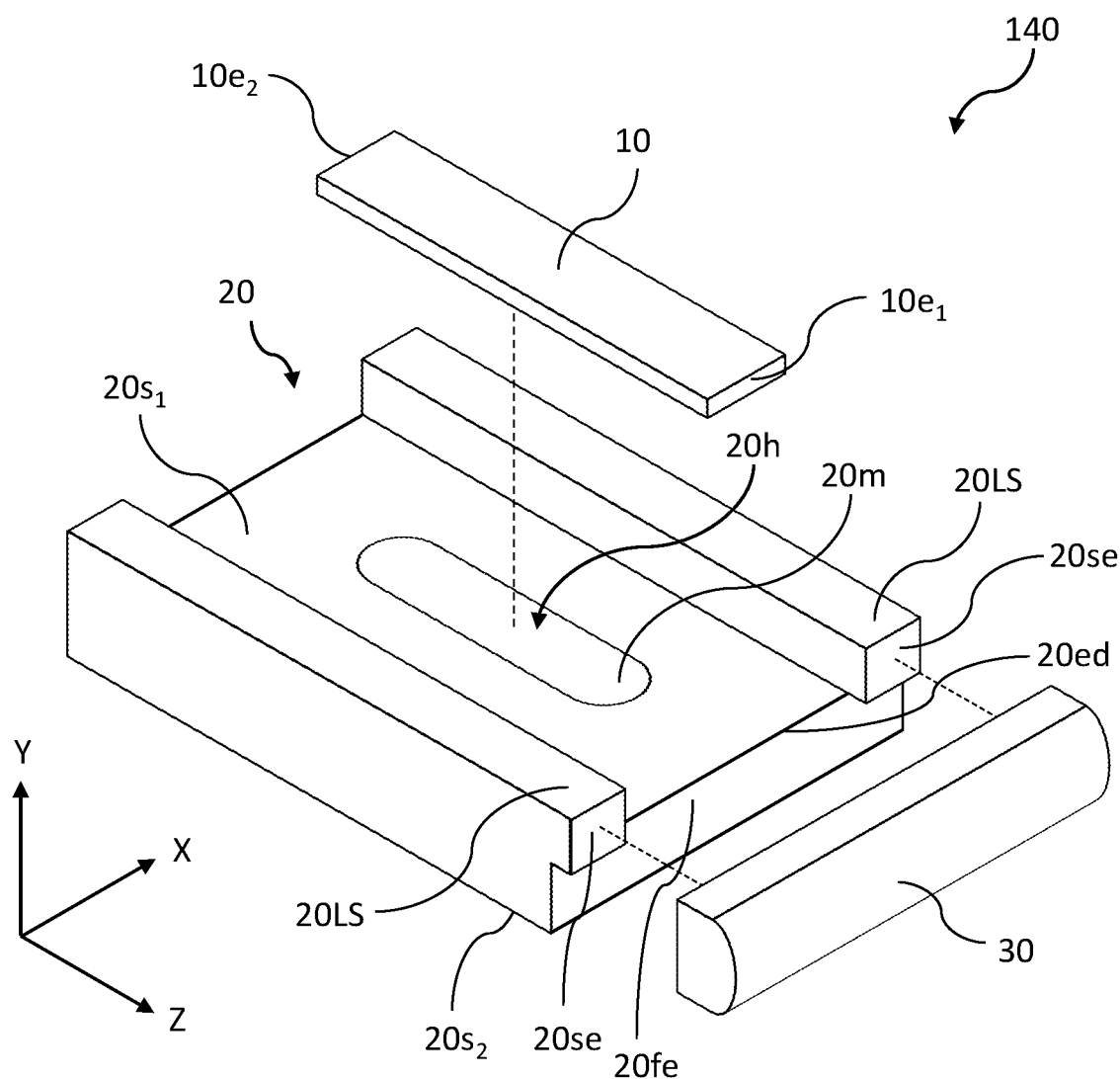
FIG. 6A is a perspective view schematically showing an example of a configuration of a laser light source according to Modified Example 4 of the first embodiment of the present disclosure.
Figure 6B:
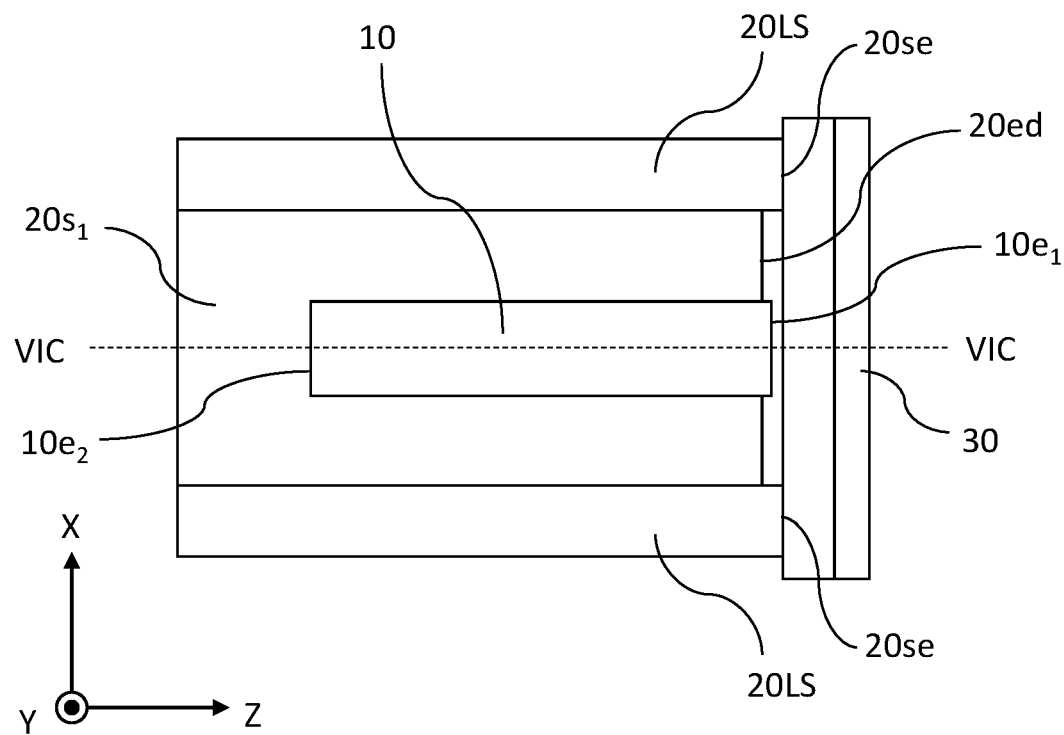
FIG. 6B is a top plan view schematically showing the laser light source in FIG. 6A.
Figure 6C:
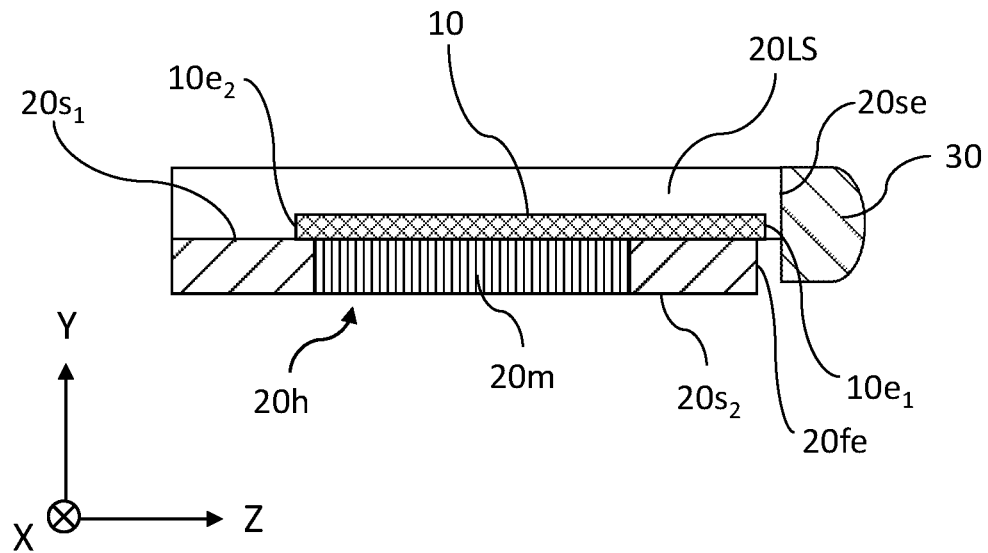
FIG. 6C is a schematic cross-sectional view of the configuration of FIG. 6B taken along line VIC-VIC, which is parallel to the YZ plane.

Next, with reference to FIG. 6A to FIG. 6C, an example of a configuration of a laser light source 140 according to Modified Example 4 of the first embodiment of the present disclosure will be described. FIG. 6A is a perspective view schematically showing an example of a configuration of the laser light source 140 according to Modified Example 4 of the first embodiment of the present disclosure. Although the laser diode chip 10, the submount 20, and the collimating lens 30 are shown isolated in FIG. 6A, they are actually bonded to one another. FIG. 6B is a top plan view schematically showing the laser light source 140 in FIG. 6A. FIG. 6C is a schematic cross-sectional view of the configuration of FIG. 6B taken along line VIC-VIC, which is parallel to the YZ plane. The laser light source 140 according to Modified Example 4 of the first embodiment differs from the laser light source 100 according to the first embodiment with respect to the configuration of the submount 20. The submount 20 according to Modified Example 4 of the first embodiment defines a throughhole 20*h* extending from the principal surface $20s_1$ and reaching the back surface $20s_2$ and includes a metal 20*m* filling the throughhole 20*h*. A portion of the submount 20 other than the throughhole 20*h* may be made of, for example, a ceramic. The metal 20*m* has a high thermal conductivity, and may contain at least one selected from the group consisting of Cu, Al, Ag, Fe, Ni, Mo, Cu, W, and CuMo, for example. The metal 20*m* has a largest size along the X direction of e.g. 0.5 mm or greater and 1.5 mm or less, and a largest size along the Z direction of e.g. 1 mm or greater and 6 mm or less. In a top plan view, a whole or a portion of the metal 20*m* may overlap the laser diode chip 10. With the laser diode chip 10 disposed in contact with the metal 20*m* of the submount 20, the heat generated from the laser diode chip 10 can be efficiently transmitted to the semiconductor laser package 40 via the metal 20*m*.

Figure 7A:
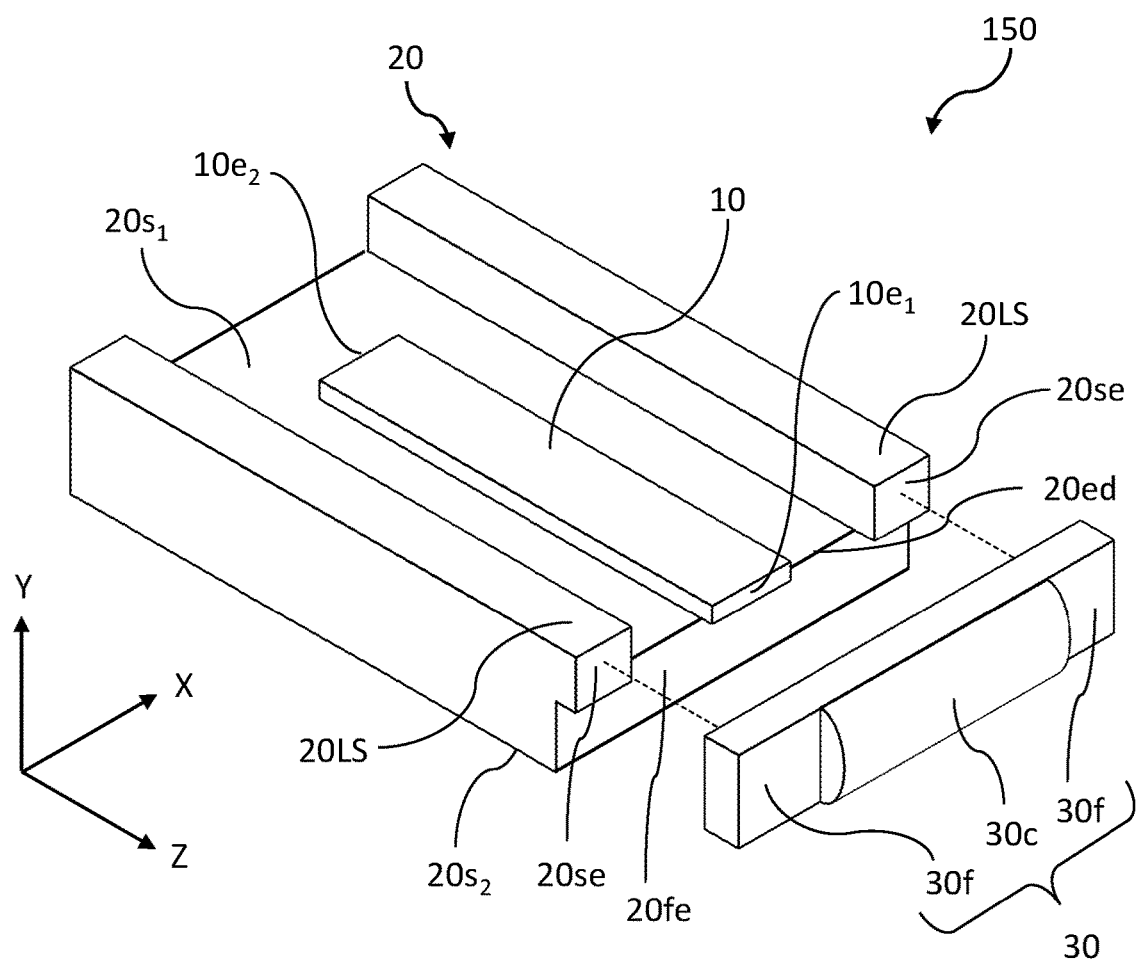
FIG. 7A is a perspective view schematically showing an example of a configuration of a laser light source according to Modified Example 5 of the first embodiment of the present disclosure.
Figure 7B:
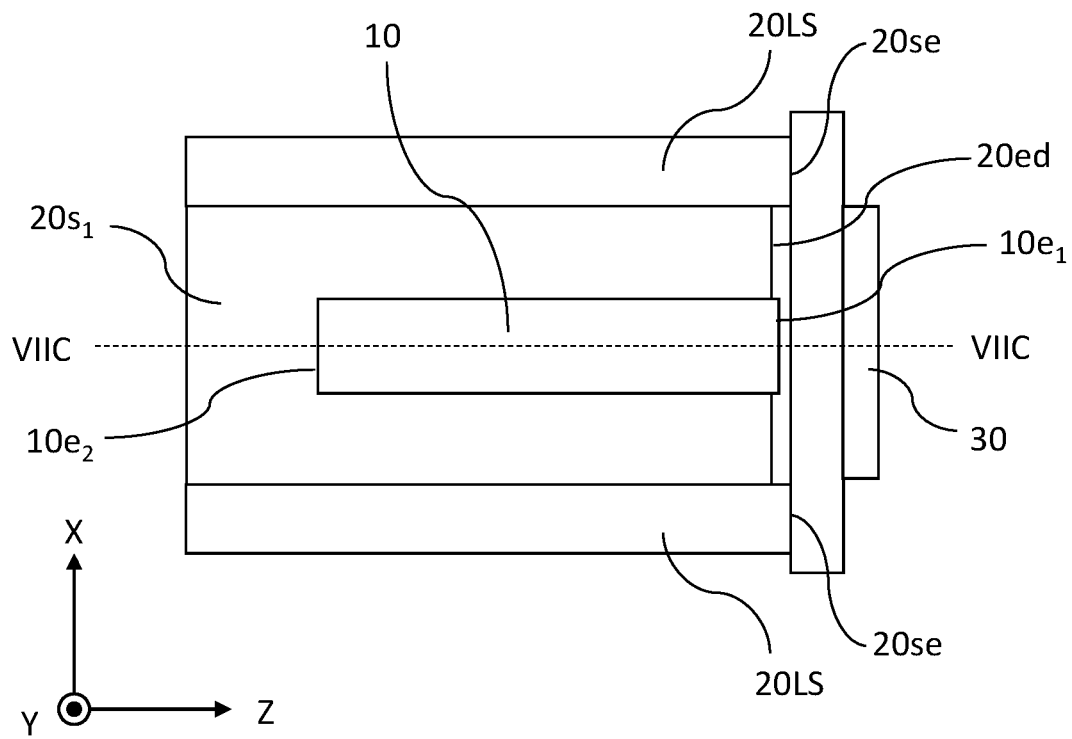
FIG. 7B is a top plan view schematically showing the laser light source in FIG. 7A.
Figure 7C:
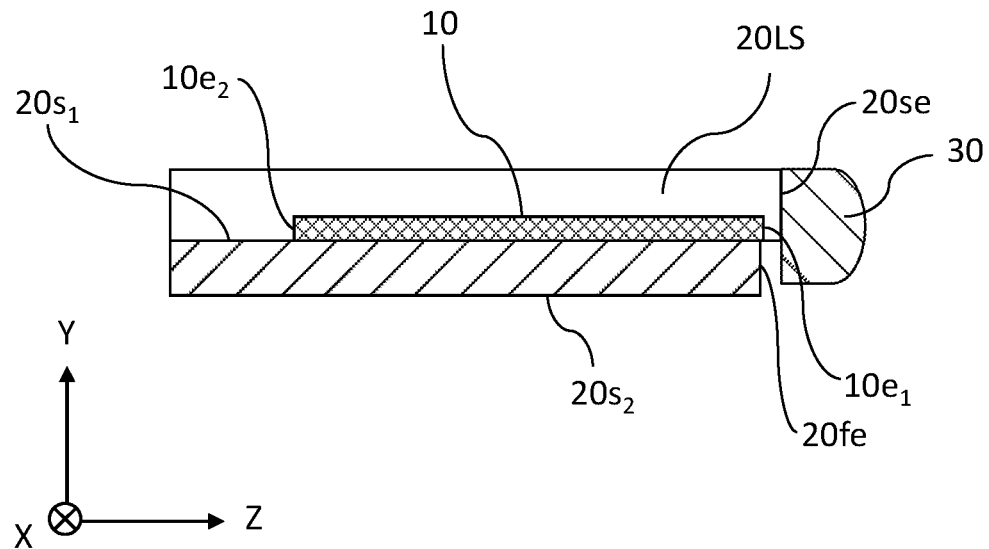
FIG. 7C is a cross-sectional view of the configuration of FIG. 7B taken along line VIIC-VIIC, which is parallel to the YZ plane.

Next, with reference to FIG. 7A to FIG. 7C, an example of a configuration of a laser light source 150 according to Modified Example 5 of the first embodiment of the present disclosure will be described. FIG. 7A is a perspective view schematically showing an example of a configuration of the laser light source 150 according to Modified Example 5 of the first embodiment of the present disclosure. FIG. 7B is a top plan view schematically showing the laser light source 150 in FIG. 7A. FIG. 7C is a schematic cross-sectional view of the configuration of FIG. 7B taken along line VIIC-VIIC, which is parallel to the YZ plane. The laser light source 150 according to Modified Example 5 of the first embodiment differs from the laser light source 100 according to the first embodiment with respect to the shape of the collimating lens 30. The collimating lens 30 according to Modified Example 5 of the first embodiment includes a pair of flat portions 30*f* and a lens curved-surface portion 30*c* located between the pair of flat portions 30*f*. Similarly to the collimating lens 30 according to the first embodiment, the lens curved-surface portion 30*c* according to Modified Example 5 of the first embodiment functions as an FAC lens.

Figure 7D:
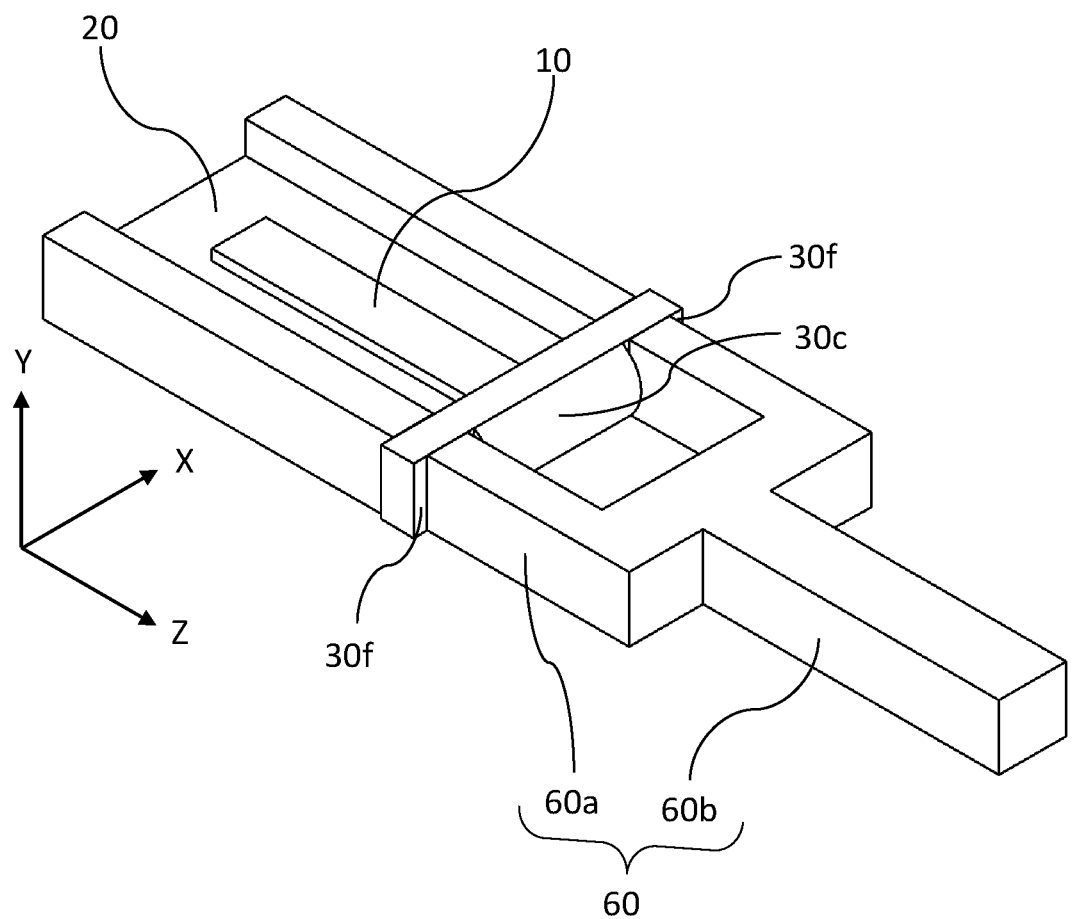
FIG. 7D is a perspective view schematically showing a collimating lens of the laser light source in FIG. 7A being bonded to a submount using a collet.

Next, with reference to FIG. 7D, an advantage of employing the pair of flat portions 30*f* of the collimating lens 30 will be described. FIG. 7D is a perspective view schematically showing the collimating lens 30 of the laser light source 150 in FIG. 7A being bonded to the submount 20 using a collet 60. The collet 60 includes fork portions 60*a* and a support portion 60*b* that is connected to the fork portions 60*a*. The collet 60 has a hollow structure, and is able to suck the collimating lens 30 and support it. Specifically, the pair of flat portions 30*f* of the collimating lens 30 are sucked onto tip portions of the fork portions 60*a* of the collet 60. A mounting apparatus may be used to hold the support portion 60*b*, and while the collimating lens 30 is supported by the fork portions 60*a*, the collimating lens 30 may be bonded to the submount 20, which allows for stably applying a load in a direction perpendicular to the end surfaces 20*se* of the pair of lens supports 20LS. With the load applied, the bonding member existing between the collimating lens 30 and the end surfaces 20*se* of the pair of lens supports 20LS is heated.

A mirror (not shown) may be provided between the fork portions 60*a* of the collet 60. While laser light is allowed to be emitted from the laser diode chip 10 in the Z direction, the collimating lens 30 is bonded to the submount 20, and laser light that is reflected at the mirror (not shown) along the Y direction may be received by a photodetection device, so that alignment between the collimating lens 30 and the emission end surface 10*e*$_1$ of the laser diode chip 10 can be performed more accurately. The photodetection device may be a power meter, a parallelism meter, or a beam profiler, for example.

In Modified Examples of any laser light source according to the present disclosure, the submount 20 may further include a pair of heat insulators. Each of the pair of heat insulators may be provided in a path, within the submount 20, from a corresponding one of the pair of lens supports 20LS to a location at which the laser diode chip 10 is fixed. Hereinafter, representative modified examples will be specifically described.

Figure 8A:
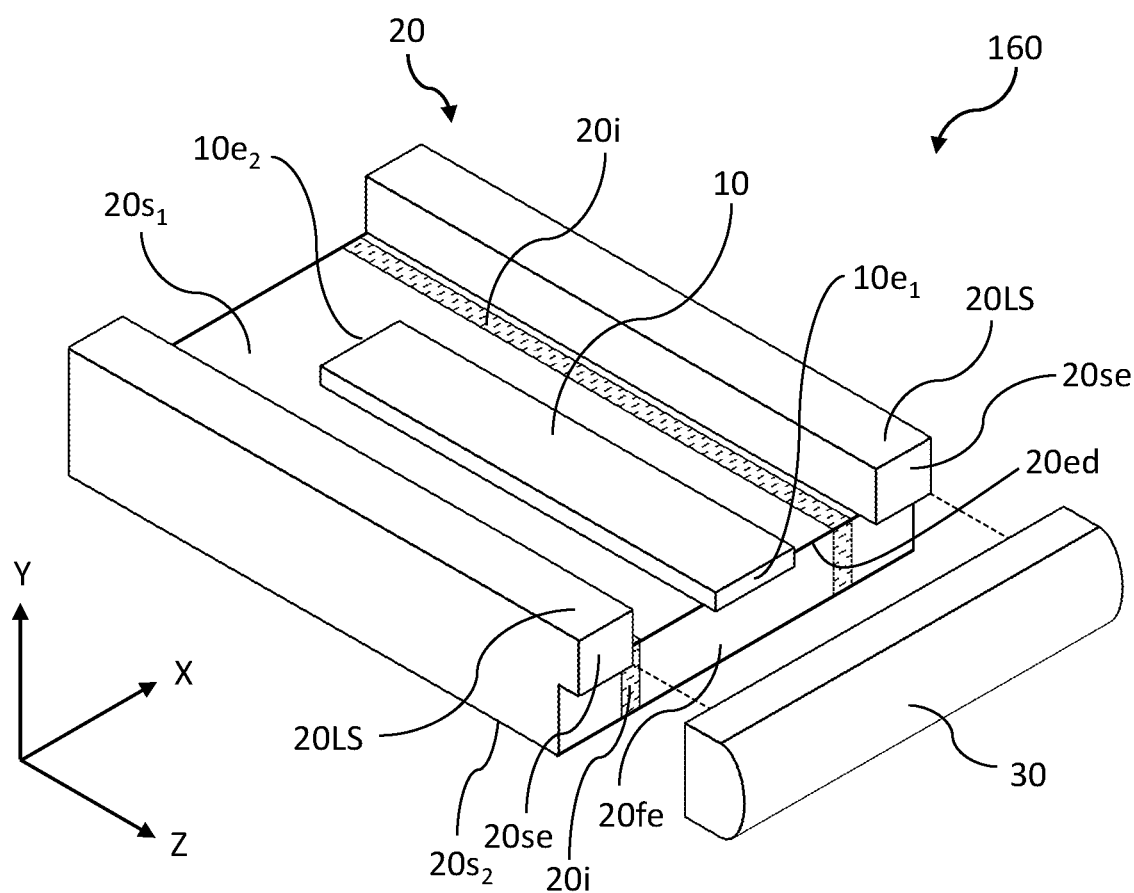
FIG. 8A is a perspective view schematically showing an example of a configuration of a laser light source according to Modified Example 6 of the first embodiment of the present disclosure.
Figure 8B:
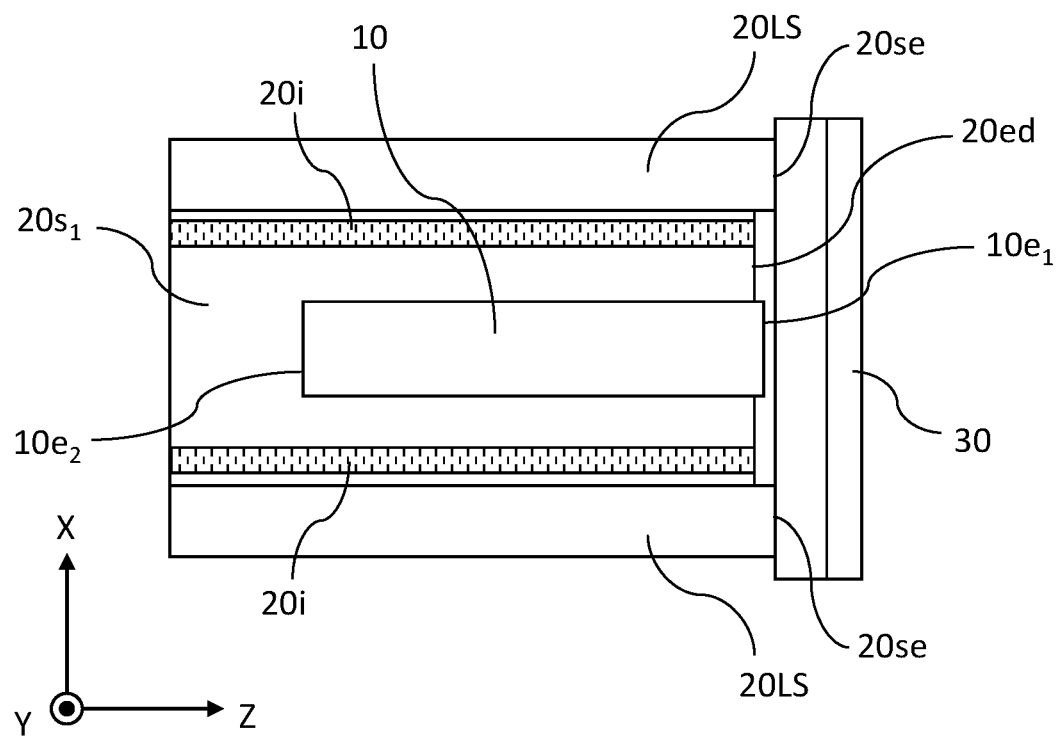
FIG. 8B is a top plan view schematically showing the laser light source in FIG. 8A.
Figure 8C:
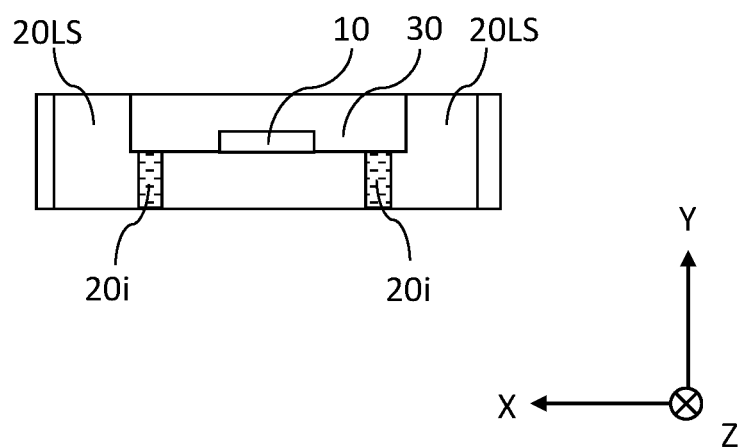
FIG. 8C is a rear view schematically showing the laser light source in FIG. 8A.

With reference to FIG. 8A to FIG. 8C, an example of a configuration of a laser light source 160 according to Modified Example 6 of the first embodiment of the present disclosure will be described. FIG. 8A is a perspective view schematically showing an example of a configuration of the laser light source 160 according to Modified Example 6 of the first embodiment of the present disclosure. FIG. 8B and FIG. 8C are a top plan view and a rear view, respectively, schematically showing the laser light source 160 in FIG. 8A. The laser light source 160 according to Modified Example 6 of the first embodiment differs from the laser light source 100 according to the first embodiment in that the submount 20 includes a pair of heat insulators 20*i* extending along the cavity length direction in a plate-like portion, which is a portion of the submount 20 other than the pair of lens supports 20LS. The plate-like portion may define a recess as shown in FIG. 3A. The part of the plate-like portion that overlaps the principal surface 20*s*$_1$ in a top plan view is located between the pair of heat insulators 20*i*. The pair of heat insulators 20*i* are not in contact with respective ones of the pair of lens supports 20LS. The pair of heat insulators 20*i* may be made of a glass fiber material or calcium silicate, for example. The thickness of each heat insulator 20*i* along the X direction is preferably 0.1 mm or greater and 1 mm or less. The pair of heat insulators 20*i* allows for reducing transmission of heat, applied to the bonding member during bonding of the end surfaces 20*se* of the pair of lens supports 20LS and the collimating lens 30, to the laser diode chip 10.

Figure 9A:
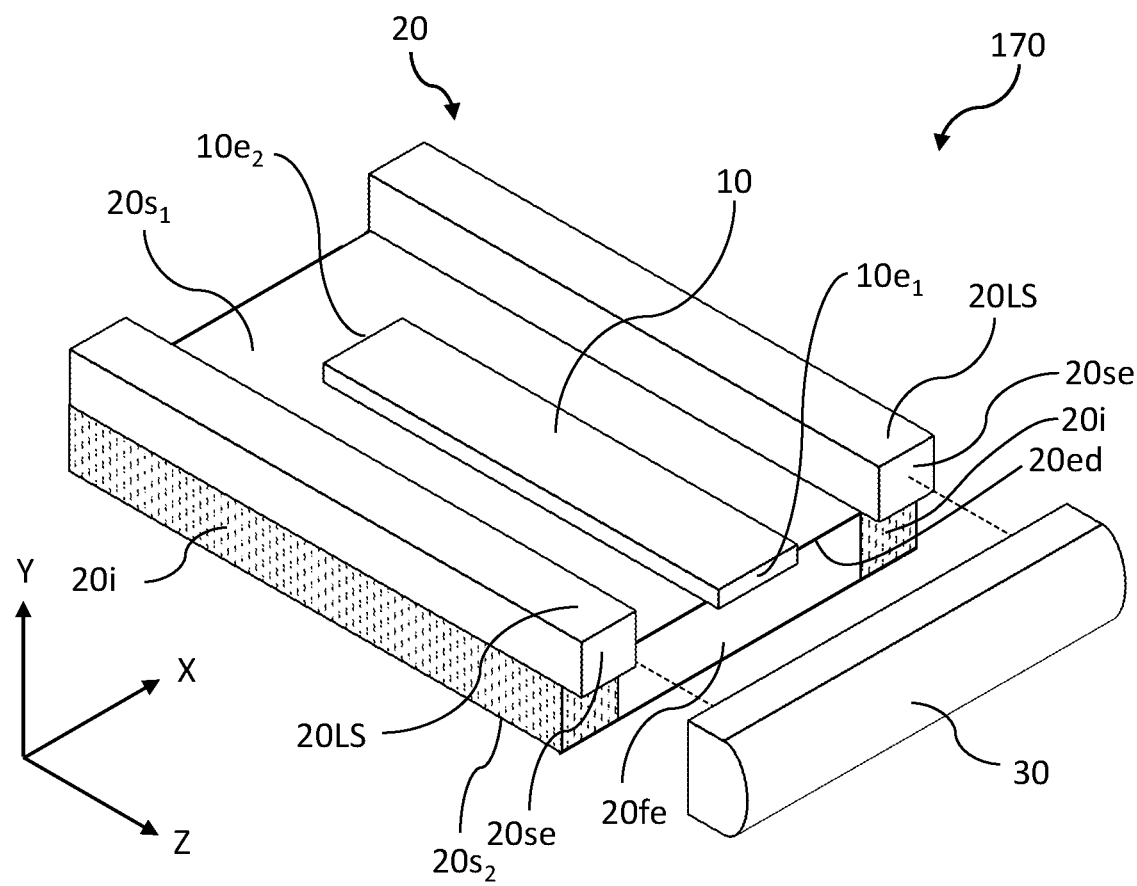
FIG. 9A is a perspective view schematically showing an example of a configuration of a laser light source according to Modified Example 7 of the first embodiment of the present disclosure.
Figure 9B:
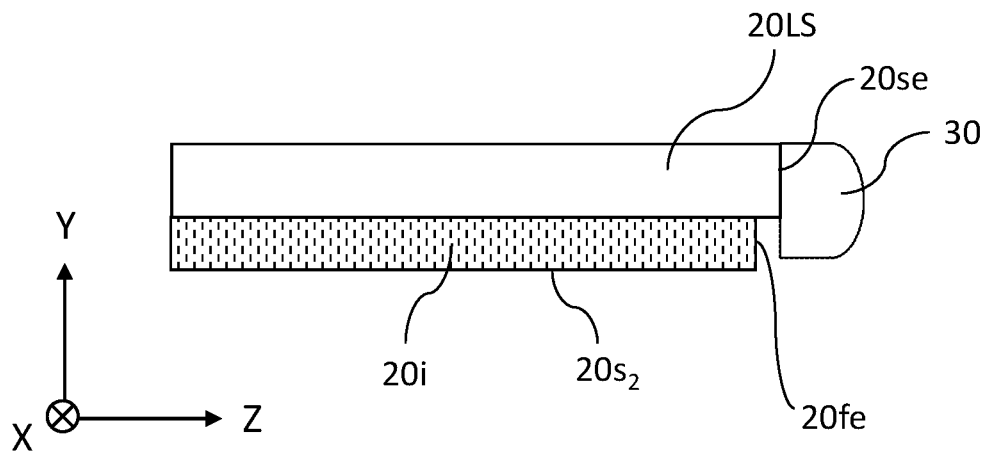
FIG. 9B is a side view schematically showing the laser light source in FIG. 9A.
Figure 9C:
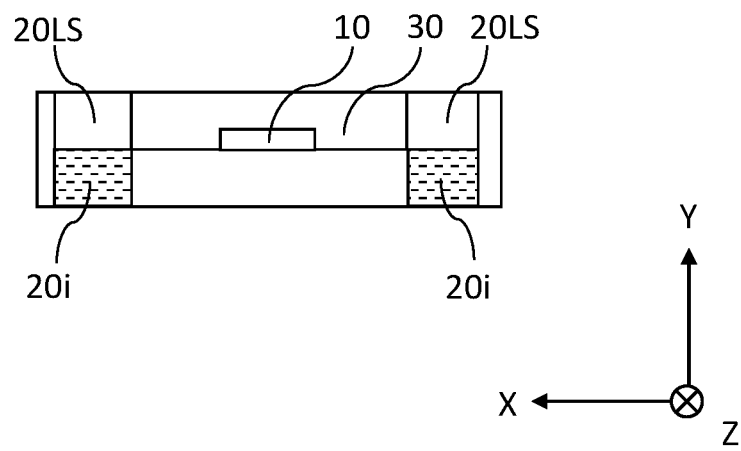
FIG. 9C is a rear view schematically showing the laser light source in FIG. 9A.

Next, with reference to FIG. 9A to FIG. 9C, an example of a configuration of a laser light source 170 according to Modified Example 7 of the first embodiment of the present disclosure will be described. FIG. 9A is a perspective view schematically showing an example of a configuration of the laser light source 170 according to Modified Example 7 of the first embodiment of the present disclosure. FIG. 9B and FIG. 9C are a side view and a rear view, respectively, schematically showing the laser light source 170 in FIG. 9A. The laser light source 170 according to Modified Example 7 of the first embodiment of the present disclosure differs from the laser light source 160 according to Modified Example 6 of the first embodiment in that the pair of heat insulators 20*i* are respectively located immediately under the pair of lens supports 20LS, so as to be in contact with the pair of lens supports 20LS. Also with the pair of heat insulators 20*i* in this arrangement, transmission of heat, applied to the bonding member during bonding of the end surfaces 20*se* of the pair of lens supports 20LS and the collimating lens 30, to the laser diode chip 10 can be reduced. In the laser light source 170 according to Modified Example 7, the lateral width of the principal surface 20*s*$_1$ located between the pair of heat insulators 20*i*, taken along the X direction, is larger than in the laser light source 160 according to Modified Example 6. Therefore, the heat generated from the laser diode chip 10 during operation of the laser light source 170 can be more efficiently released to the outside via the portion that the overlaps the principal surface 20*s*$_1$ in a top plan view.

Second Embodiment

Next, with reference to FIG. 10A to FIG. 10D, a fundamental example of a configuration of a laser light source according to a second embodiment of the present disclosure will be described.

Figure 10A:
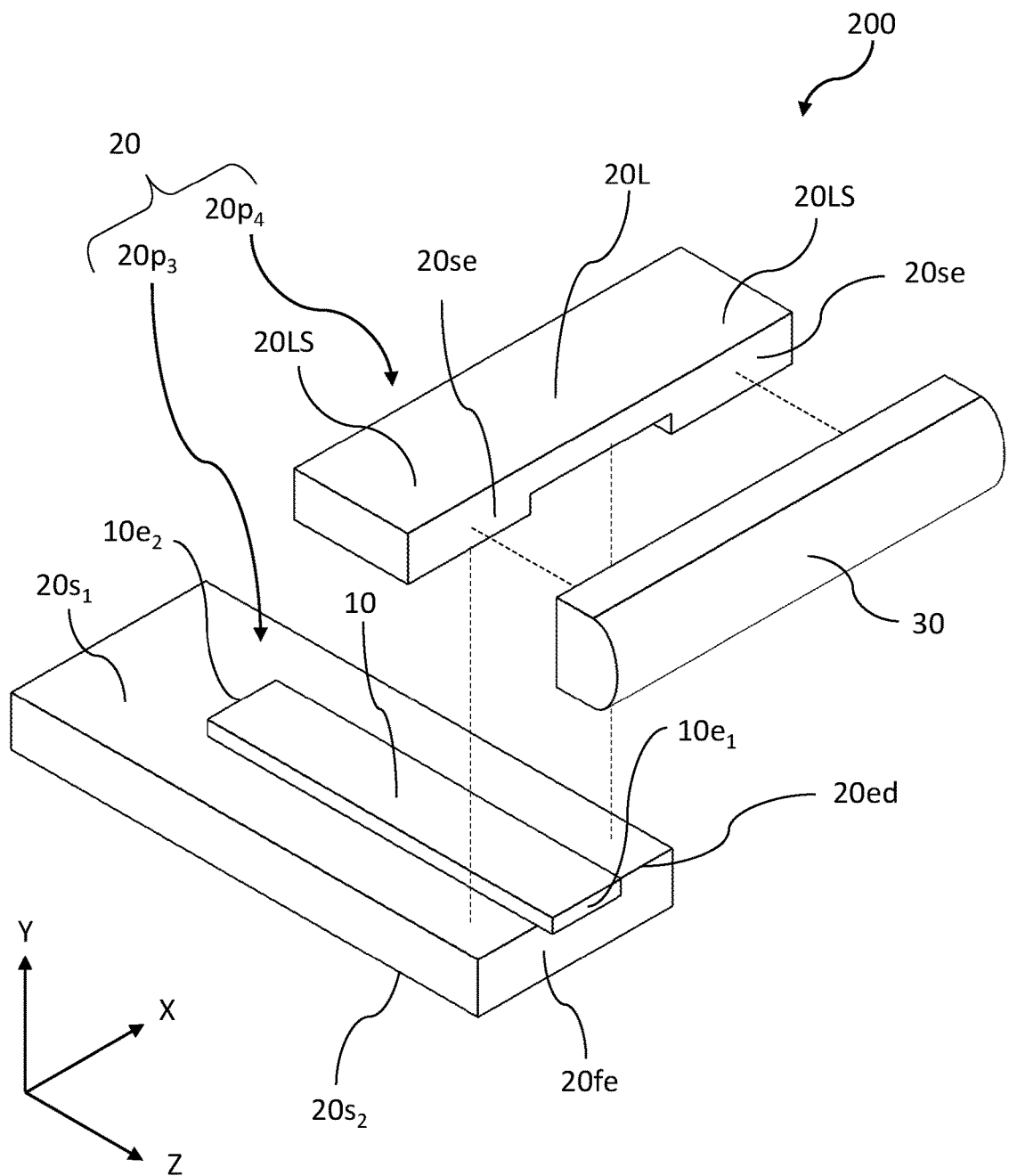
FIG. 10A is a perspective view schematically showing an example of a configuration of a laser light source according to a second embodiment of the present disclosure.
Figure 10B:
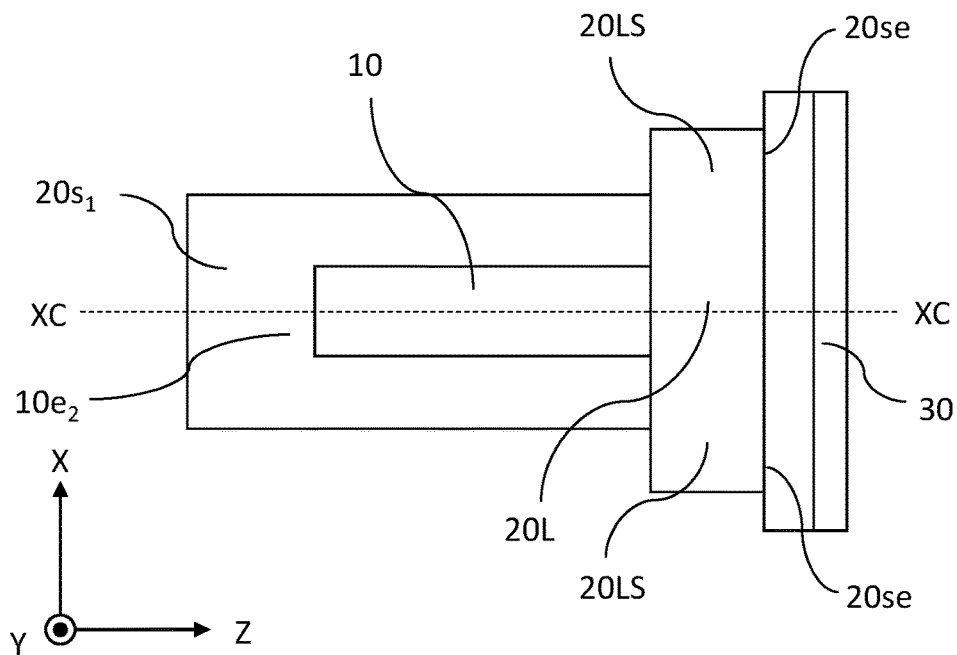
FIG. 10B is a top plan view schematically showing the laser light source in FIG. 10A.
Figure 10C:
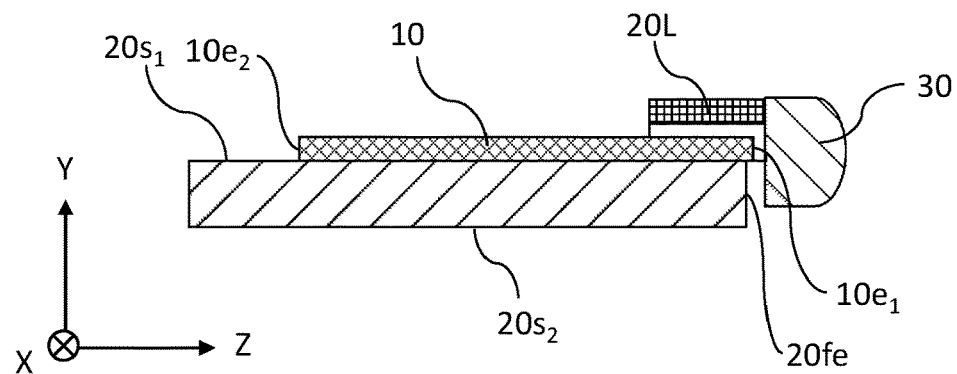
FIG. 10C is a cross-sectional view of the configuration of FIG. 10B taken along line XC-XC, which is parallel to the YZ plane.
Figure 10D:
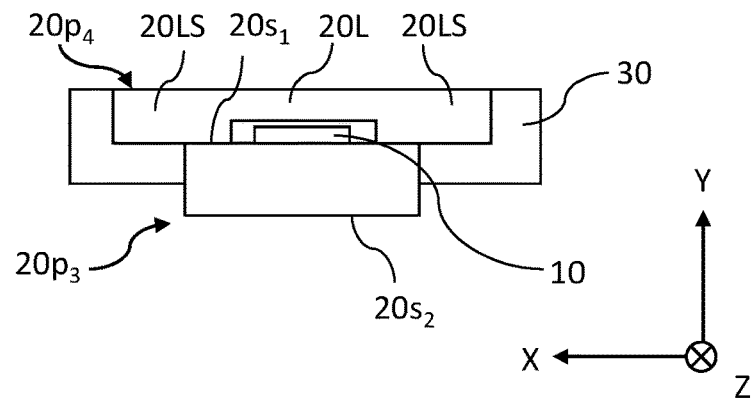
FIG. 10D is a rear view schematically showing the laser light source in FIG. 10A.

FIG. 10A is a perspective view schematically showing an example of a configuration of a laser light source 200 according to the second embodiment of the present disclosure. FIG. 10B is a top plan view schematically showing the laser light source 200 in FIG. 10A. FIG. 10C is a schematic cross-sectional view of the configuration of FIG. 10B taken along line XC-XC, which is parallel to the YZ plane. FIG. 10D is a rear view schematically showing the laser light source 200 in FIG. 10A. The laser light source 200 according to the second embodiment differs from the laser light source 100 according to the first embodiment in the configuration of the submount 20. The submount 20 according to the second embodiment includes a third submount portion 20*p*$_3$ and a fourth submount portion 20*p*$_4$. The third submount portion 20*p*$_3$ includes a principal surface 20*s*$_1$, a back surface 20*s*$_2$, and a front end surface 20*fe*. The fourth submount portion 20*p*$_4$ includes: a pair of lens supports 20LS that are fixed to the principal surface 20*s*$_1$ of the third submount portion 20*p*$_3$; and a connecting portion 20L that connects together the pair of lens supports 20LS. The connecting portion 20L connects the pair of lens supports 20LS without hindering propagation of laser light emitted from the emission end surface 10*e*$_1$ of the laser diode chip 10. In the submount 20 of this example, the third submount portion 20$p_3$ and the fourth submount portion 20$p_4$ are separate pieces. As in this example, the submount 20 may include a portion having the principal surface 20$s_1$ and a portion having the pair of lens supports 20LS, these portions being separate pieces. Although the third submount portion 20$p_3$, the fourth submount portion 20$p_4$, and the collimating lens 30 are shown isolated in FIG. 10A, they are actually bonded to one another. The pair of lens supports 20LS and the connecting portion 20L of the fourth submount portion 20$p_4$ are monolithically molded.

As shown in FIG. 10B and FIG. 10C, in a top plan view, the connecting portion 20L overlaps the emission end surface 10$e_1$ of the laser diode chip 10. As shown in FIG. 10D, the fourth submount portion 20$p_4$ is disposed on the principal surface 20$s_1$ of the third submount portion 20$p_3$ over the laser diode chip 10. With the size of the fourth submount portion 20$p_4$ along the X direction being larger than the size of the third submount portion 20$p_3$ along the X direction, the area of the end surfaces 20se of the pair of lens supports 20LS can be increased. This allows for facilitating the collimating lens 30 onto the end surfaces 20se of the pair of lens supports 20LS. The size of the pair of lens supports 20LS of the fourth submount portion 20$p_4$ along the Y direction may be approximately the same as the size of the collimating lens 30 along the Y direction. The size of the pair of lens supports 20LS of the fourth submount portion 20$p_4$ along the Y direction may be greater than, equal to, or smaller than the size of the collimating lens 30 along the Y direction. The fourth submount portion 20$p_4$ may have a size along the X direction of e.g. 0.5 mm or greater and 4 mm or less, the largest size along the Y direction of e.g. 0.5 mm or greater and 2 mm or less, and a size along the Z direction of e.g. 0.5 mm or greater and 1 mm or less.

In the producing of the laser light source 200 according to the second embodiment, a step of bonding the laser diode chip 10 to the principal surface 20$s_1$ of the third submount portion 20$p_3$, a step of bonding the fourth submount portion 20$p_4$ to the principal surface 20$s_1$ of the third submount portion 20$p_3$ over the laser diode chip 10 and a step of bonding the collimating lens 30 to the end surfaces 20se of the pair of lens supports 20LS of the fourth submount portion 20$p_4$ may be performed in this order. Alternatively, the fourth submount portion 20$p_4$ with the collimating lens 30 bonded thereto may be bonded onto the third submount portion 20$p_3$ with the laser diode chip 10 bonded to its principal surface 20$s_1$.

In the laser light source 200 according to the second embodiment, as in the laser light source 100 according to the first embodiment, the submount 20 supports the laser diode chip 10 on the principal surface 20$s_1$ between the pair of lens supports 20LS, and supports the collimating lens 30 on the end surfaces 20se of the pair of lens supports 20LS. This allows for facilitating alignment between the laser diode chip 10 and the collimating lens 30, and allows for obtaining the laser light source 200 of a small size. Furthermore, in the laser light source 200 according to the second embodiment, as in the laser light source 100 according to the first embodiment, even when the laser diode chip 10 is disposed on the submount 20 in a face-down state, climbing-up of the bonding member onto the emission end surface 10$e_1$ of the laser diode chip 10 can be reduced.

Modified Examples of Second Embodiment

Next, Modified Examples 1 to 3 of the laser light source 200 according to the second embodiment of the present disclosure will be described. Descriptions repetitive of the description above may be omitted.

Figure 11A:
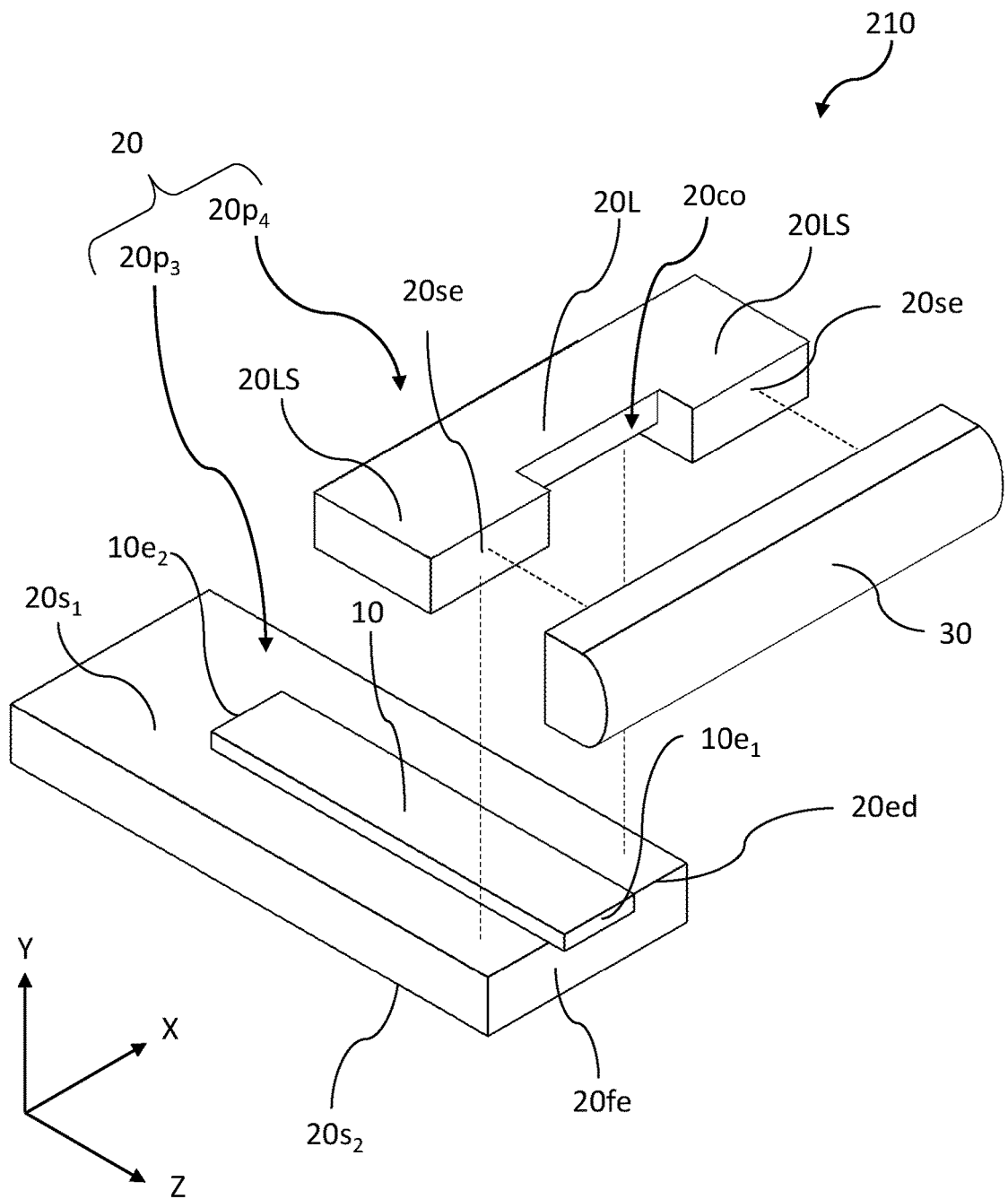
FIG. 11A is a perspective view schematically showing an example of a configuration of a laser light source according to Modified Example 1 of the second embodiment of the present disclosure.
Figure 11B:
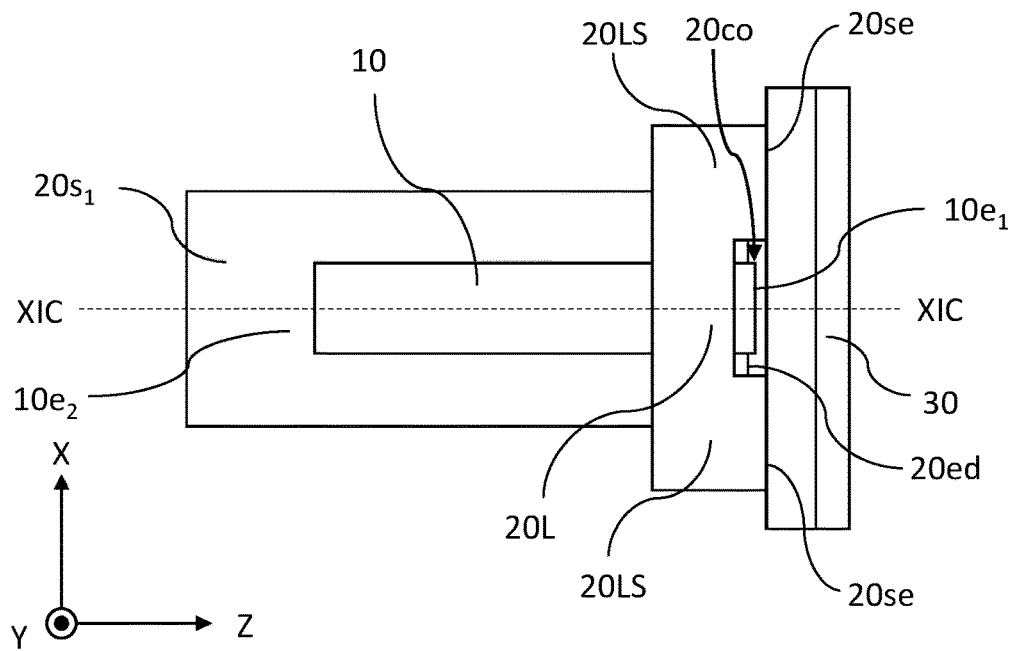
FIG. 11B is a top plan view schematically showing the laser light source in FIG. 11A.
Figure 11C:
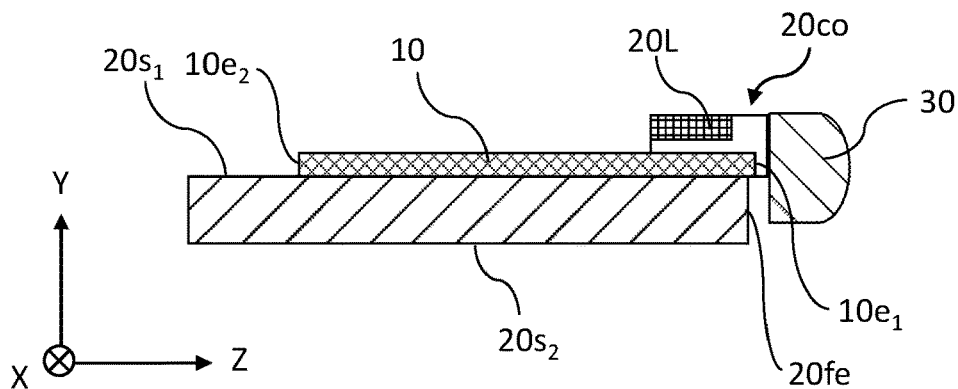
FIG. 11C is a cross-sectional view of the configuration of FIG. 11B taken along line XIC-XIC, which is parallel to the YZ plane.
Figure 11D:
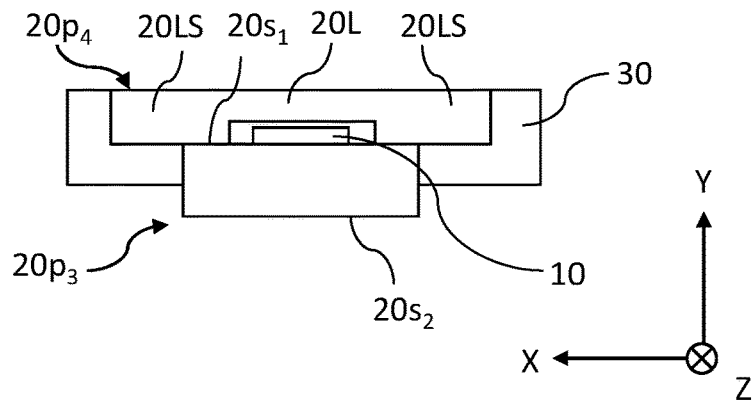
FIG. 11D is a rear view schematically showing the laser light source in FIG. 11A.

With reference to FIG. 11A to FIG. 11D, an example of a configuration of a laser light source 210 according to Modified Example 1 of the second embodiment of the present disclosure will be described. FIG. 11A is a perspective view schematically showing an example of a configuration of the laser light source 210 according to Modified Example 1 of the second embodiment of the present disclosure. FIG. 11B is a top plan view schematically showing the laser light source 210 in FIG. 11A. FIG. 11C is a schematic cross-sectional view of the configuration of FIG. 11B taken along line XIC-XIC, which is parallel to the YZ plane. FIG. 11D is a rear view schematically showing the laser light source 210 in FIG. 11A. The laser light source 210 according to Modified Example 1 of the second embodiment differs from the laser light source 200 according to the second embodiment in the shape of the fourth submount portion 20$p_4$ of the submount 20. The fourth submount portion 20$p_4$ according to Modified Example 1 of the second embodiment defines a recess 20co between the pair of lens supports 20LS in a structure same as the fourth submount portion 20$p_4$ according to the second embodiment. As shown in FIG. 11B and FIG. 11C, with the recess 20co, the connecting portion 20L does not overlap the emission end surface 10$e_1$ of the laser diode chip 10 in a top plan view. The recess 20co has a size along the X direction of e.g. 0.2 mm or greater and 3 mm or less, and a size along the Z direction of e.g. 0.5 mm or greater and 1 mm or less. The size of the recess 20co along the Z direction is larger than the distance between the end surface 20se of each of the pair of lens supports 20LS and the edge 20ed of the principal surface 20$s_1$ of the third submount portion 20$p_3$ along the Z direction. In the producing of the laser light source 210 according to Modified Example 1 of the second embodiment, the recess 20co allows for facilitating alignment between the emission end surface 10$e_1$ of the laser diode chip 10 and the fourth submount portion 20$p_4$ and alignment between the emission end surface 10$e_1$ of the laser diode chip 10 and the collimating lens 30.

Figure 12A:
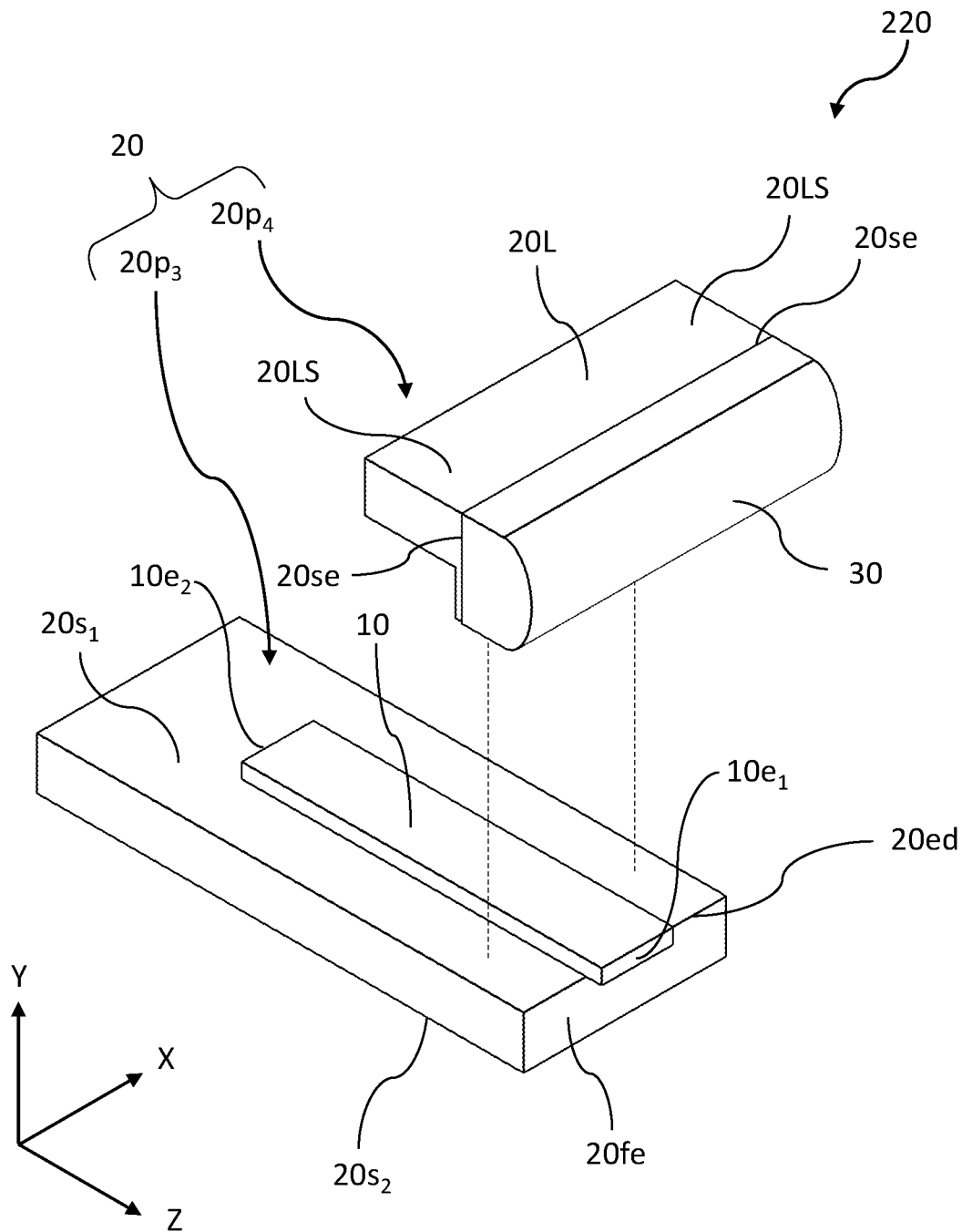
FIG. 12A is a perspective view schematically showing an example of a configuration of a laser light source according to Modified Example 2 of the second embodiment of the present disclosure.
Figure 12B:
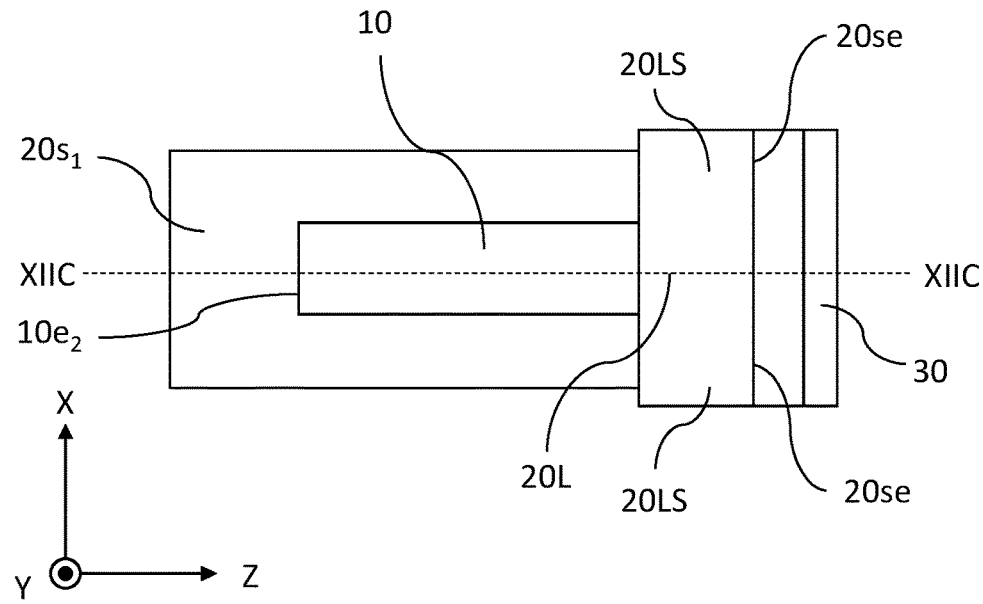
FIG. 12B is a top plan view schematically showing the laser light source in FIG. 12A.
Figure 12C:
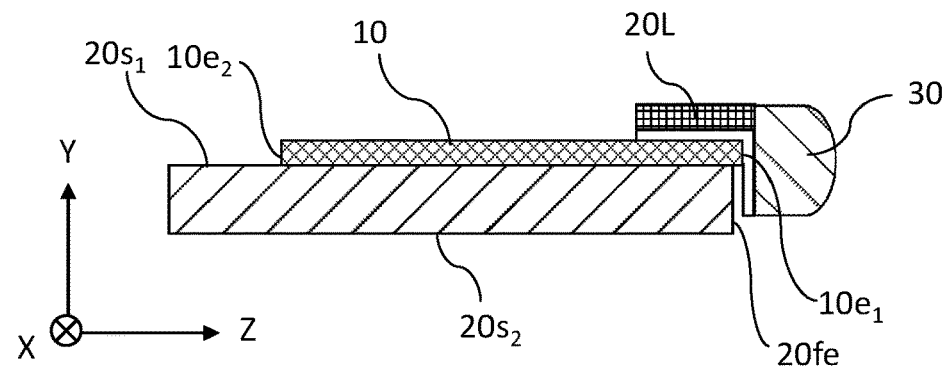
FIG. 12C is a cross-sectional view of the configuration of FIG. 12B taken along line XIIC-XIIC, which is parallel to the YZ plane.
Figure 12D:
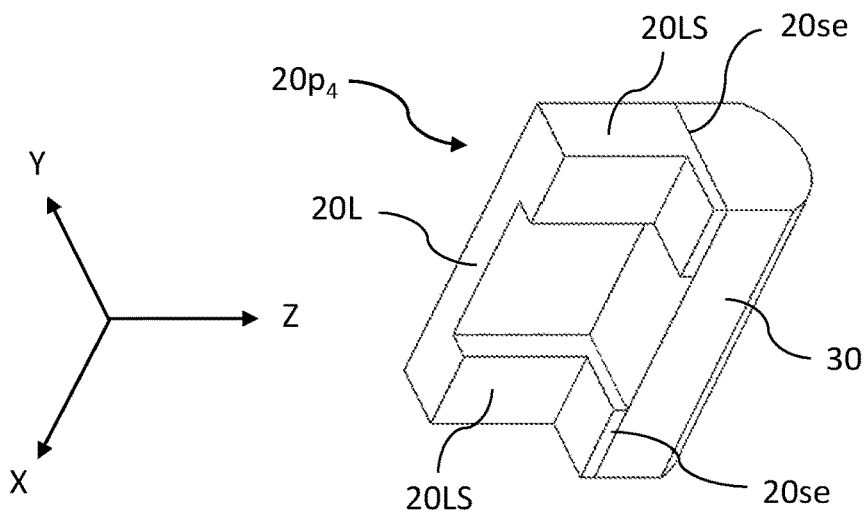
FIG. 12D is a perspective view schematically showing a fourth submount portion and a collimating lens in FIG. 12A.

Next, with reference to FIG. 12A to FIG. 12D, an example of a configuration of a laser light source 220 according to Modified Example 2 of the second embodiment of the present disclosure will be described. FIG. 12A is a perspective view schematically showing an example of a configuration of the laser light source 220 according to Modified Example 2 of the second embodiment of the present disclosure. FIG. 12B is a top plan view schematically showing the laser light source 220 in FIG. 12A. FIG. 12C is a schematic cross-sectional view of the configuration of FIG. 12B taken along line XIIC-XIIC, which is parallel to the YZ plane. FIG. 12D is a perspective view schematically showing the fourth submount portion 20$p_4$ and the collimating lens 30 shown in FIG. 12A. The laser light source 220 according to Modified Example 2 of the second embodiment differs from the laser light source 200 according to the second embodiment in the fourth submount portion 20$p_4$ of the submount 20 and the collimating lens 30. As shown in FIG. 12D, according to Modified Example 2 of the second embodiment, the fourth submount portion 20$p_4$ of the submount 20 and the collimating lens 30 are monolithically molded. The fourth submount portion 20$p_4$ and the collimating lens 30 do not need to be bonded to each other, so that the size of the fourth submount portion 20$p_4$ according to Modified Example 2 of the second embodiment along the X direction does not need to be as large as the size of the fourth submount portion 20$p_4$ according to the second embodiment along the X direction. The fourth submount portion $20p_4$ according to Modified Example 2 of the second embodiment has a size along the X direction of e.g. 0.2 mm or greater and 3 mm or less, the largest size along the Y direction of e.g. 0.3 mm or greater and 1 mm or less, and a size along the Z direction of e.g. 0.5 mm or greater and 1 mm or less.

The fourth submount portion $20p_4$ and the collimating lens 30 being monolithically molded may be made of, for example, at least one selected from the group consisting of glass, quartz, synthetic quartz, sapphire, transparent ceramics, and plastics. When the fourth submount portion $20p_4$ and the collimating lens 30 that are monolithically molded are transparent, alignment between the emission end surface $10e_1$ of the laser diode chip 10 and the collimating lens 30 can be facilitated.

Figure 13A:
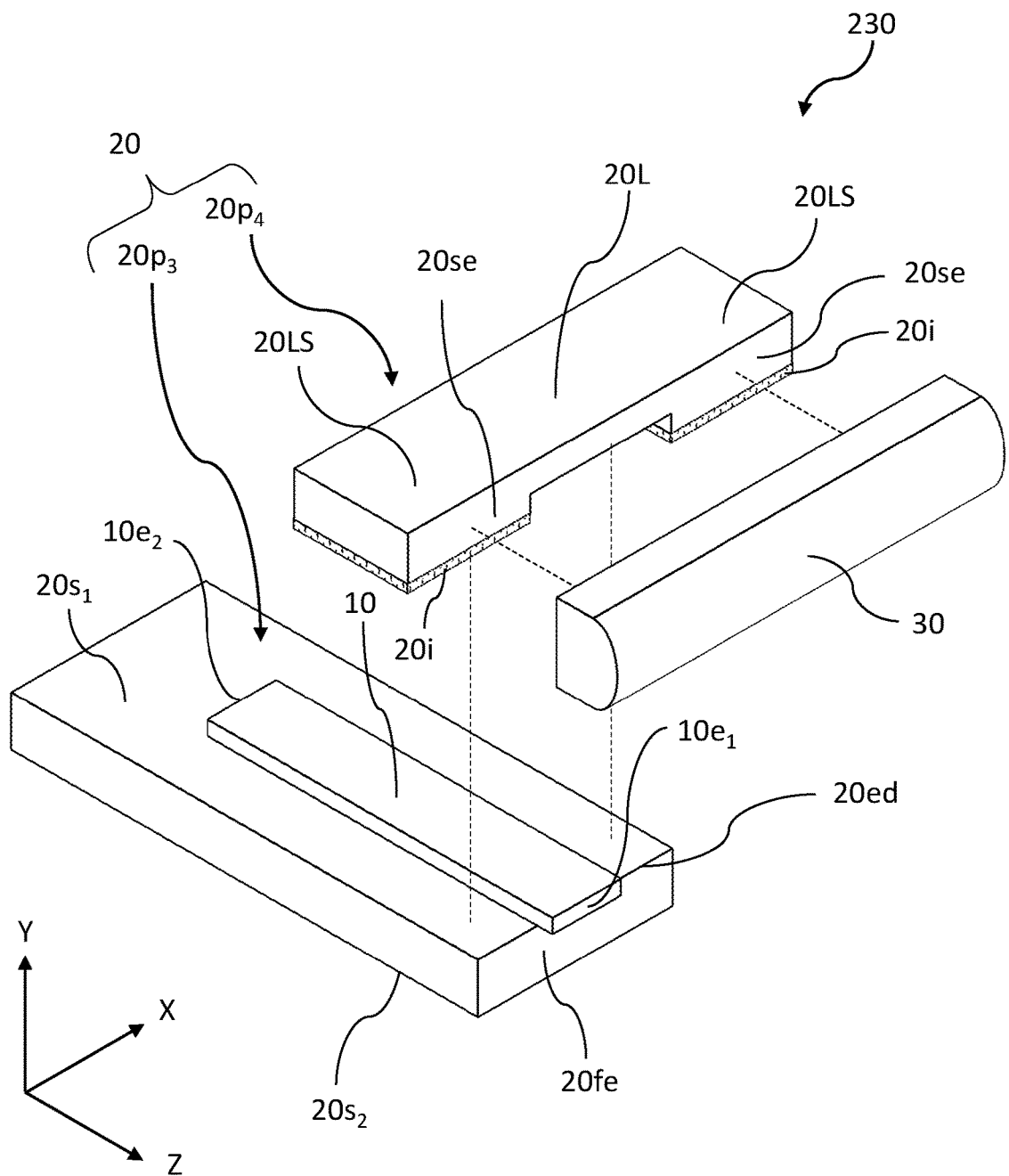
FIG. 13A is a perspective view schematically showing an example of a configuration of a laser light source according to Modified Example 3 of the second embodiment of the present disclosure.
Figure 13B:
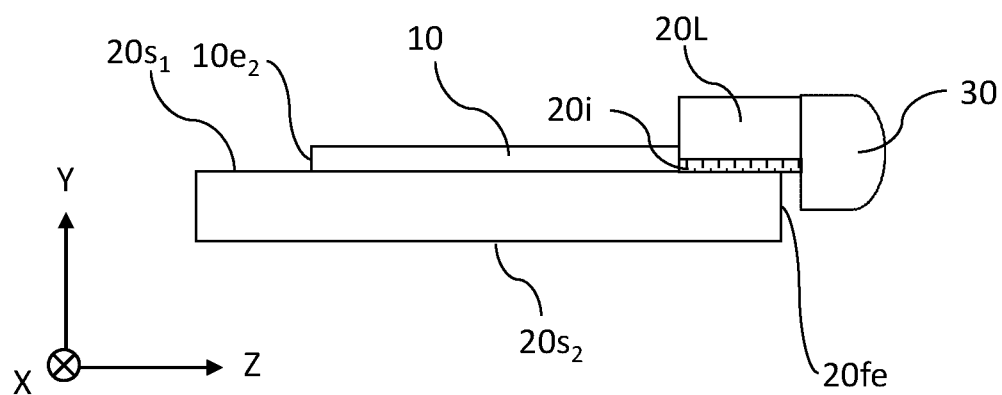
FIG. 13B is a side view schematically showing the laser light source in FIG. 13A.
Figure 13C:
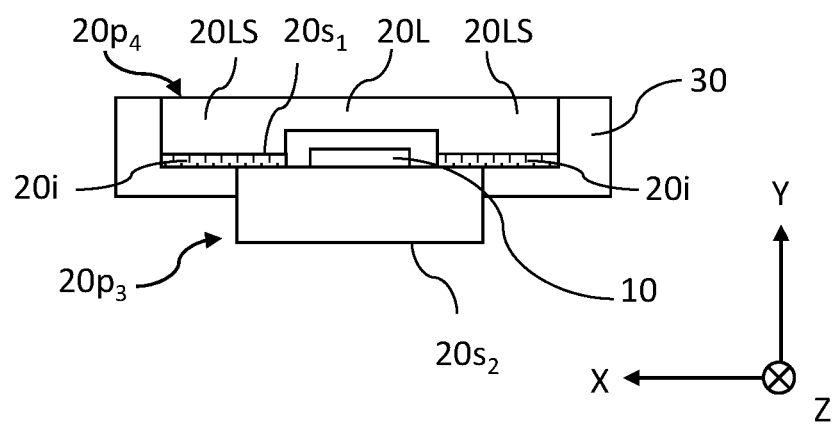
FIG. 13C is a rear view schematically showing the laser light source in FIG. 13A.

Next, with reference to FIG. 13A to FIG. 13C, an example of a configuration of a laser light source 230 according to Modified Example 3 of the second embodiment of the present disclosure will be described. FIG. 13A is a perspective view schematically an example of a configuration of the laser light source 230 according to Modified Example 3 of the second embodiment of the present disclosure. FIG. 13B and FIG. 13C are a side view and a rear view, respectively, schematically showing the laser light source 230 in FIG. 13A. The laser light source 230 according to modified Example 3 of the second embodiment differs from the laser light source 200 according to the second embodiment in that a pair of heat insulators 20i are disposed between the third submount portion $20p_3$ and the fourth submount portion $20p_4$. The pair of lens supports 20LS of the fourth submount portion $20p_4$ are fixed to the principal surface $20s_1$ of the third submount portion $20p_3$ respectively via the pair of heat insulators 20i. Each heat insulator 20i preferably has a thickness along the Y direction of 0.1 mm or greater and 1 mm or less. The pair of heat insulators 20i serve to restrain the heat applied to the bonding member during bonding of the end surfaces 20se of the pair of lens supports 20LS and the collimating lens 30 from being transmitted to the laser diode chip 10.

Components in the embodiments described above and components in Modified Examples thereof may be combined in any appropriate manners.

Method of Manufacturing the Laser Light Source

Hereinafter, with reference to FIGS. 14A to 14E and FIGS. 15A to 15G, an example of steps of the laser light source 100 according to the first embodiment will be described. Steps in manufacturing may differ according to the wavelength of the laser light to be emitted from the laser diode chip 10. The steps in manufacturing that will be described below are applicable to not only the laser light source 100 of the first embodiment but also any other laser light source according to the present disclosure.

FIG. 14A to FIG. 14E are diagrams for describing an example of steps in manufacturing the laser light source 100 in the case in which the submount 20 and the collimating lens 30 are bonded using an organic bonding member.

Figure 14A:
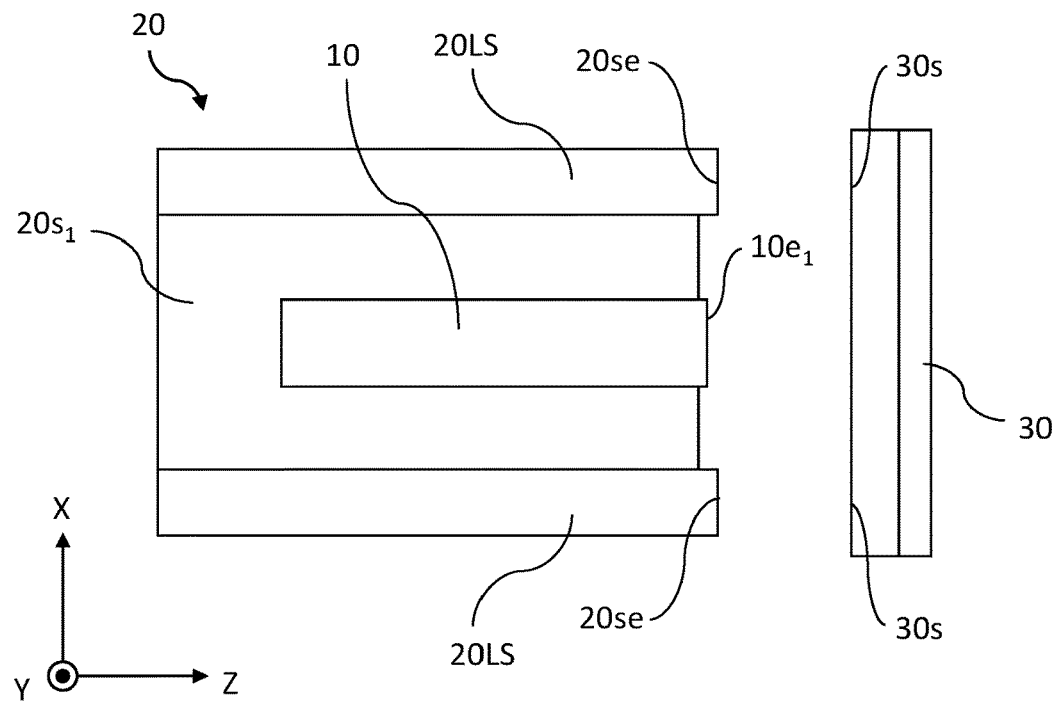
FIG. 14A is a diagram for describing an example of a step in manufacturing the laser light source in the case in which the submount and the collimating lens are bonded using an organic bonding member.

In the first step, as shown in FIG. 14A, a submount 20 and a collimating lens 30 are provided. The submount 20 has a principal surface $20s_1$ on which a laser diode chip 10 is to be fixed, and a pair of lens supports 20LS located on opposite sides with respect to an emission end surface $10e_1$ of the laser diode chip 10.

Figure 14B:
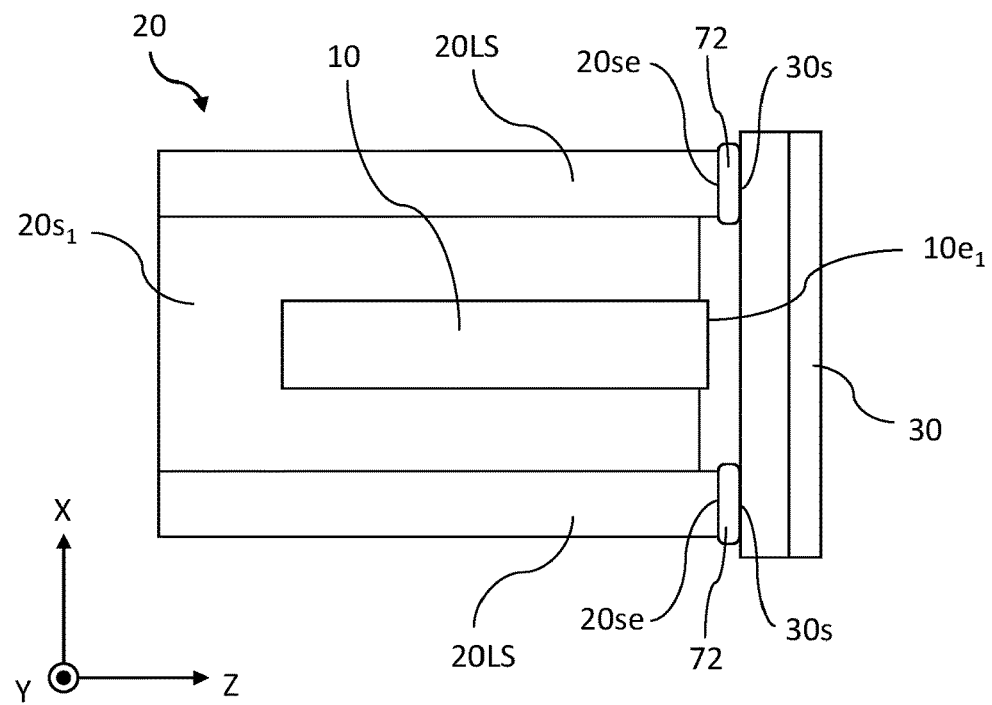
FIG. 14B is a diagram for describing an example of a step in manufacturing the laser light source in the case in which the submount and the collimating lens are bonded using an organic bonding member.

In the next step, as shown in FIG. 14B, end surfaces 20se of the pair of lens supports 20LS and a bonding surface 30s of the collimating lens 30 are connected via an organic bonding member 72. Before connection, the organic bonding member 72 is applied to at least one of: the end surfaces 20se of the pair of lens supports 20LS; and the bonding surface 30s of the collimating lens 30. In the case in which the organic bonding member 72 is used, the emission wavelength of the laser diode chip 10 is preferably a long wavelength, e.g., red or infrared, because the influences of the aforementioned attraction of dust on the emission end surface $10e_1$ of the laser diode chip 10 do not need to be considered in the case of laser light of long wavelengths. The organic bonding member 72 may be a UV-curing resin that cures with ultraviolet irradiation, for example. For the organic bonding member 72, for example, AT3862P available from NTT Advanced Technology Corporation can be used. The cure shrinkage of AT3862P in response to ultraviolet irradiation is 0.5%. The organic bonding member 72 may have a thickness of e.g. 20 μm or greater and 100 μm or less.

Figure 14C:
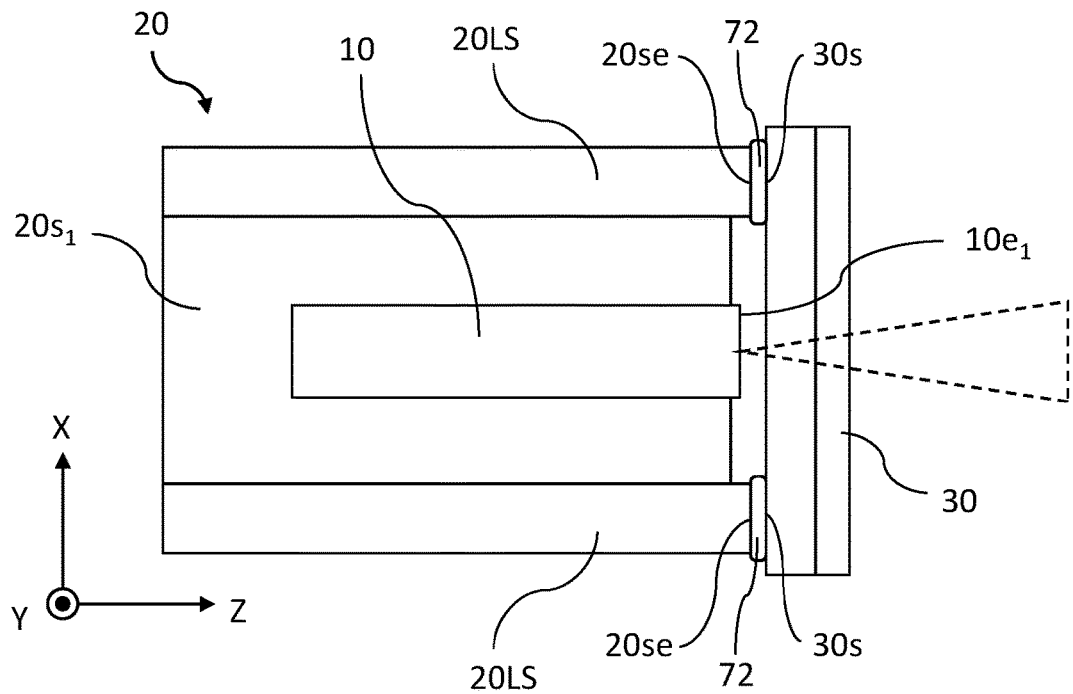
FIG. 14C is a diagram for describing an example of a step in manufacturing the laser light source in the case in which the submount and the collimating lens are bonded using an organic bonding member.
Figure 14D:
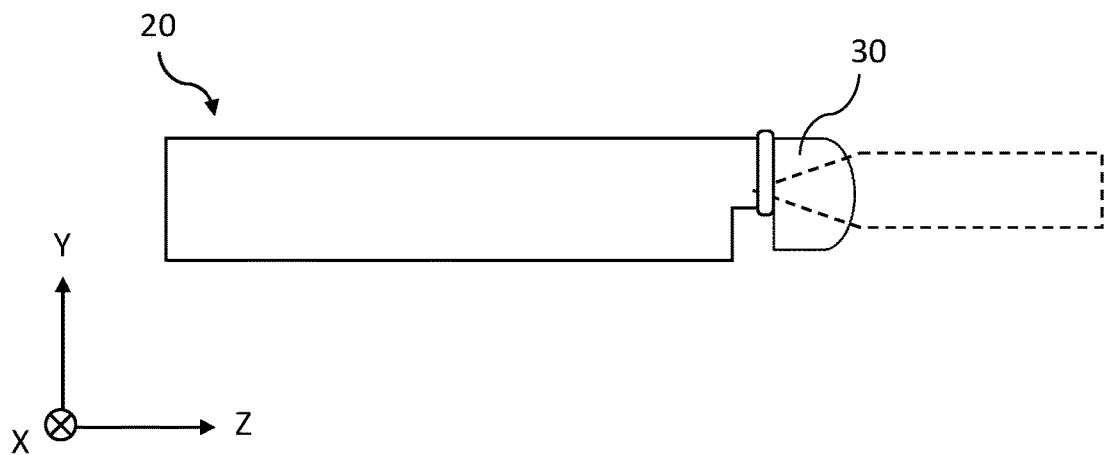
FIG. 14D is a diagram for describing an example of a step in manufacturing the laser light source in the case in which the submount and the collimating lens are bonded using an organic bonding member.

In the next step, as shown in FIG. 14C and FIG. 14D, while the laser diode chip 10 is caused to emit laser light, the position of the collimating lens 30 is adjusted so that the laser light is accurately collimated. FIG. 14C and FIG. 14D are a top plan view and a side view, respectively, schematically showing the laser light source 100 during fabrication. The regions represented by broken lines in FIG. 14C and FIG. 14D show the expanse of laser light. Because the organic bonding member before curing can be easily modified in shape, such positional adjustments can be performed.

Figure 14E:
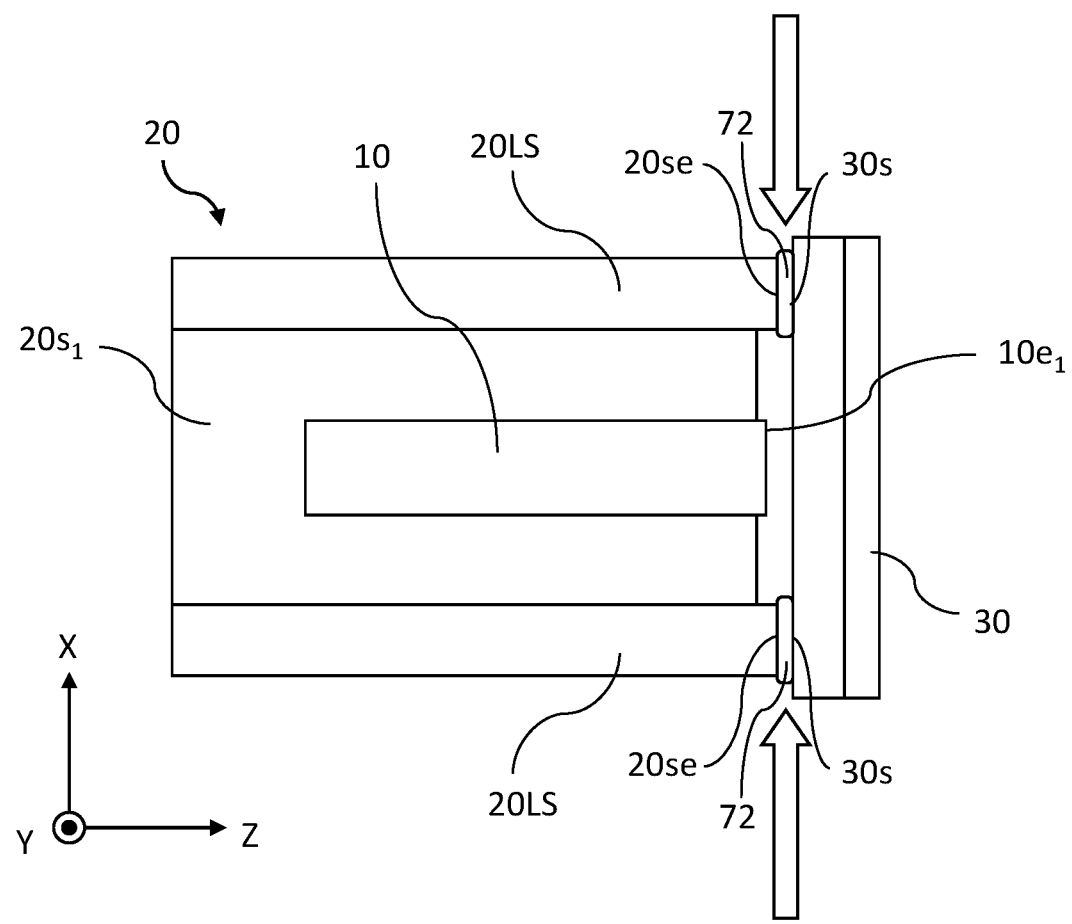
FIG. 14E is a diagram for describing an example of a step in manufacturing the laser light source in the case in which the submount and the collimating lens are bonded using an organic bonding member.

In the next step, as shown in FIG. 14E, the organic bonding member 72 is irradiated with ultraviolet (indicated by blank arrows) so as to cure, so that the end surfaces 20se of the pair of lens supports 20LS and the bonding surface 30s of the collimating lens 30 are bonded by the organic bonding member 72. The cure shrinkage of the organic bonding member 72 due to ultraviolet irradiation is preferably 2% or less. With a shrinkage within this range, deviations in the position of the collimating lens 30 from the adjusted position can be reduced.

In a laser light source according to the present disclosure as produced through the manufacturing steps described above with reference to FIG. 14A to FIG. 14E, laser light emitted from the laser diode chip 10 can be accurately collimated. These manufacturing steps are advantageous in that the position of the collimating lens 30 can be adjusted before curing of the organic bonding member.

FIG. 15A to FIG. 15G are diagrams for describing an example of steps in manufacturing the laser light source 100 in the case in which the submount 20 and the collimating lens 30 are bonded using an inorganic bonding member. In this production process, an inorganic bonding member 74 is used, instead of the organic bonding member 72. No or very small amounts of organic gas components are generated from the inorganic bonding member 74. Therefore, during operation, deteriorations of the emission end surface $10e_1$ of the laser diode chip 10 to emit light of short wavelengths, e.g., ultraviolet, blue, or green, can be reduced as described above. Because the inorganic bonding member 74 is not as modifiable as the organic bonding member 72 in shape, the manufacturing steps described below may differ from the manufacturing steps described above with reference to FIG. 14A to FIG. 14E. The order of steps in the manufacturing steps described below may be changed unless being contradictory.

Figure 15A:
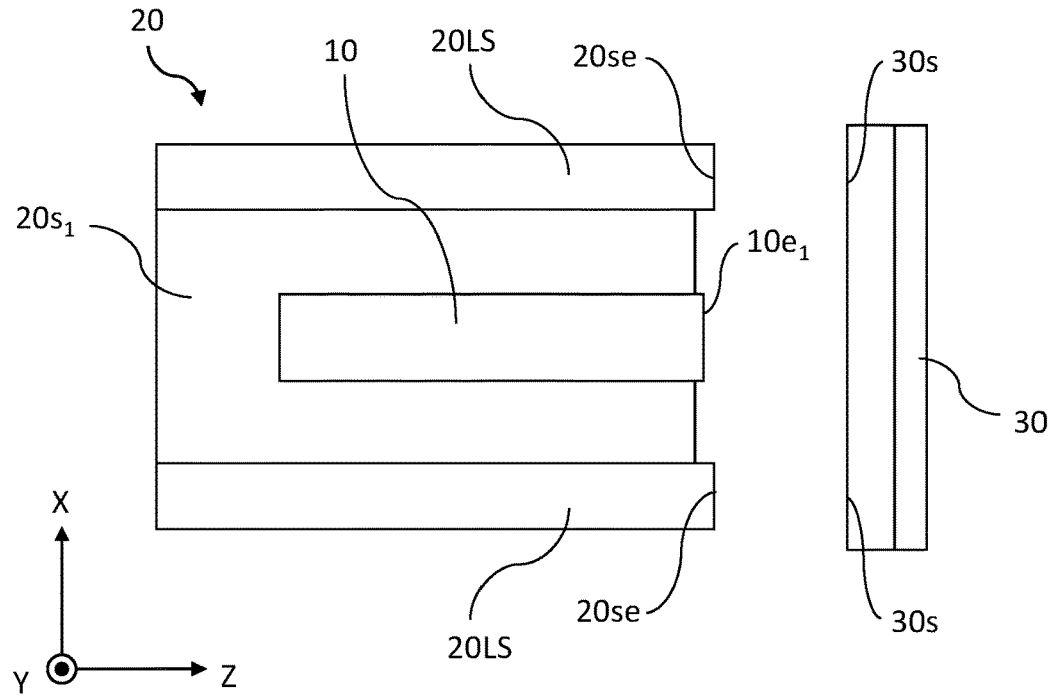
FIG. 15A is a diagram for describing an example of a step in manufacturing the laser light source in the case in which the submount and the collimating lens are bonded using an inorganic bonding member.

As shown in FIG. 15A, a submount 20 and a collimating lens 30 are provided.

The submount 20 has a principal surface $20s_1$ on which a laser diode chip 10 is to be fixed, and a pair of lens supports 20LS located at opposite sides to each other with respect to an emission end surface $10e_1$ of the laser diode chip 10.

Figure 15B:
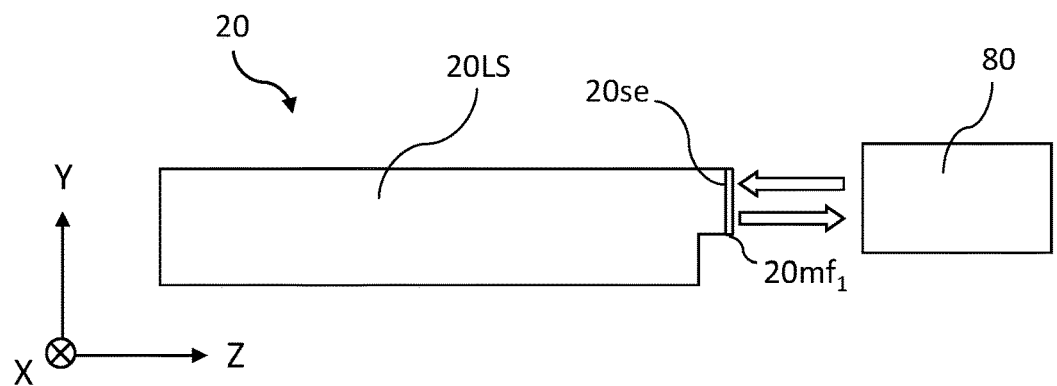
FIG. 15B is a diagram for describing an example of a step in manufacturing the laser light source in the case in which the submount and the collimating lens are bonded using an inorganic bonding member.

In the next step, as shown in FIG. 15B, a first metal film $20mf_1$ is disposed on the end surfaces 20se of the pair of lens supports 20LS. For example, the end surfaces 20se of the pair of lens supports 20LS may be plated with Au. The first metal film $20mf_1$ may contain Au, which has high oxidation resistance. A first metal film $20mf_1$ may also be provided on the front end surface 20fe shown in any of FIG. 2A, FIG. 3A, FIG. 4A, FIG. 6A, and FIG. 7A. A first metal film $20mf_1$ may also be provided on any portion of the U-shaped surface shown in FIG. 5A or FIG. 10A other than the end surfaces 20se of the pair of lens supports 20LS.

In the next step, as shown in FIG. 15B, adjustment is performed using an autocollimator 80 so that the end surfaces 20se of the pair of lens supports 20LS is parallel to a reference plane that is parallel to the XY plane. More specifically, using the autocollimator 80, an inclination of the end surfaces 20se of the pair of lens supports 20LS with reference to the reference plane is reduced. The autocollimator 80 is an optical apparatus that measures, in a non-contact manner, an inclination of a surface of a given part. Among devices used for the autocollimators 80, a laser autocollimator is configured to emit laser light and can accurately measure minute inclinations of a surface of a component utilizing the laser light having reflected at a surface of an optical part. For example, a laser autocollimator available from SURUGA SEIKI CO., LTD. has an angular resolution of 0.0008 degrees. Blank arrows shown in FIG. 15B represent laser light that is emitted from the laser autocollimator 80 and reflected at the first metal film $20mf_1$. The first metal film $20mf_1$ efficiently reflects laser light that is emitted from the laser autocollimator 80.

Figure 15C:
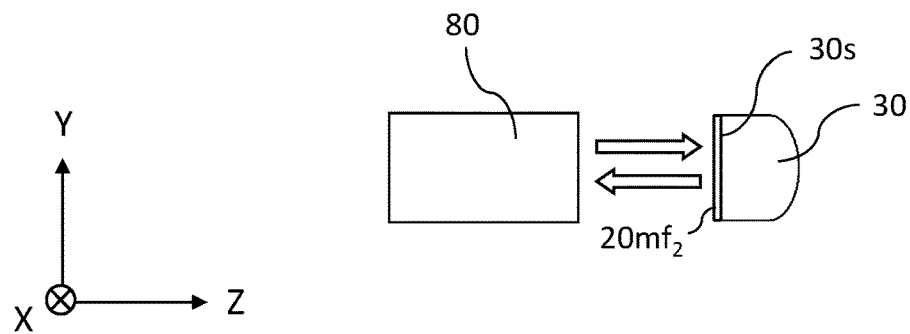
FIG. 15C is a diagram for describing an example of a step in manufacturing the laser light source in the case in which the submount and the collimating lens are bonded using an inorganic bonding member.

In the next step, as shown in FIG. 15C, a second metal film $20mf_2$ is disposed on the bonding surface 30s of the collimating lens 30. The second metal film $20mf_2$ may be made of the same material as that of the first metal film $20mf_1$.

In the next step, adjustment is performed using an autocollimator 80 so that the bonding surface 30s of the collimating lens 30 is parallel to the aforementioned reference plane, as shown in FIG. 15C. More specifically, using the autocollimator 80, an inclination of the bonding surface 30s of the collimating lens 30 with respect to a reference plane is reduced. The autocollimator 80 for adjusting the bonding surface 30s of the collimating lens 30 may be the same as or different from the autocollimator 80 that is used in adjusting the end surfaces 20se of the pair of lens supports 20LS. In the case in which the same laser autocollimator 80 is used, the laser light that is emitted from the laser autocollimator 80 may be separated into two laser light beams through optics such as a beam splitter, so that one of the two separated light beams is reflected at the first metal film $20mf_1$ and that the other is reflected at the second metal film $20mf_2$.

In the next step, as shown in FIG. 15D, while maintaining the end surfaces 20se of the pair of lens supports 20LS and the bonding surface 30s of the collimating lens 30 to be parallel to the reference plane, the end surfaces of the pair of lens supports 20LS and the bonding surface 30s of the collimating lens 30 are connected via the inorganic bonding member 74. Before connection, the inorganic bonding member 74 is applied to at least one of: the end surfaces 20se of the pair of lens supports 20LS; and the bonding surface 30s of the collimating lens 30.

The inorganic bonding member 74 may contain AuSn, for example. The thickness of the inorganic bonding member 74 is 5 μm or less, and may preferably be 2.5 μm or less. The inorganic bonding member 74 may be made of a metal film of AuSn or an AuSn paste, for example. A metal film of AuSn may be disposed by sputtering. The organic binder contained in the AuSn paste can be vaporized by heating the inorganic bonding member 74 through laser irradiation as described below. When the volumetric ratio of the organic binder within the AuSn paste is e.g. 10% or greater and 20% or less, shrinking of the inorganic bonding member 74 when all of the organic binder is vaporized can be reduced to 0.5 μm or less. Therefore, even when the inorganic bonding member 74 is heated through laser irradiation, the inclination between the end surfaces 20se of the pair of lens supports 20LS and the bonding surface 30s of the collimating lens 30 will not become excessively great. Examples of a material of the inorganic bonding member 74 other than a metal film of AuSn or an AuSn paste include a solder material such as an Au—Sn eutectic solder or an Sn—Ag—Cu solder, and a nanoparticle material such as Ag nanoparticles, Cu nanoparticles, and Au nanoparticles.

Figure 15E:
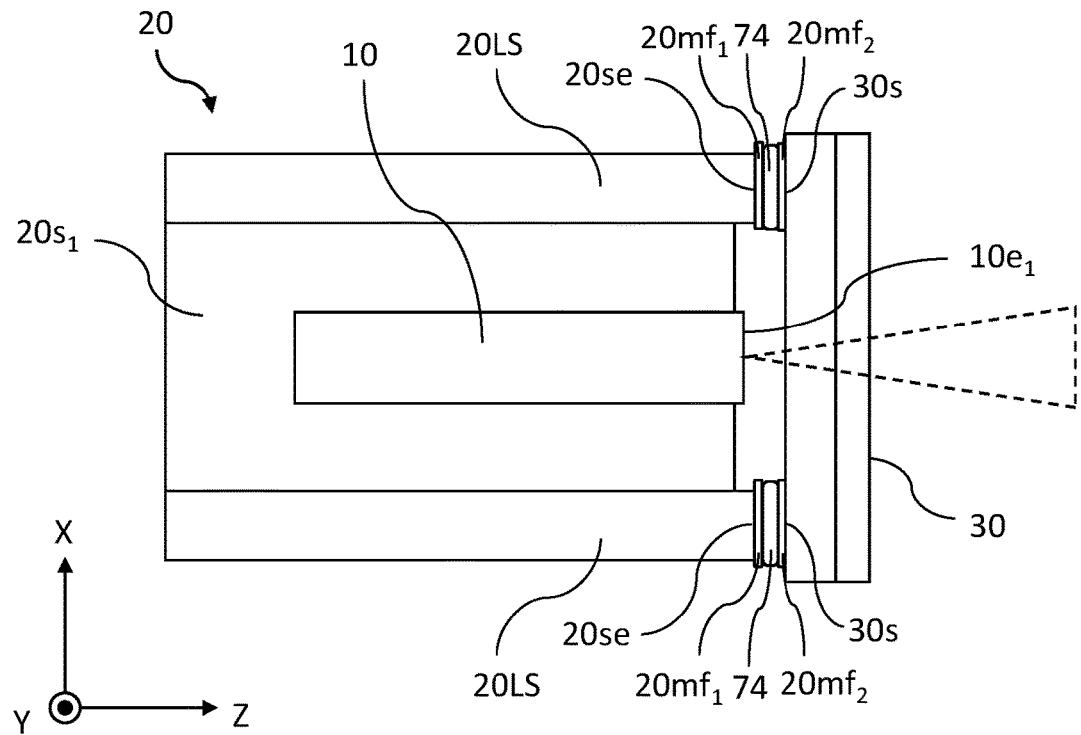
FIG. 15E is a diagram for describing an example of a step in manufacturing the laser light source in the case in which the submount and the collimating lens are bonded using an inorganic bonding member.
Figure 15F:
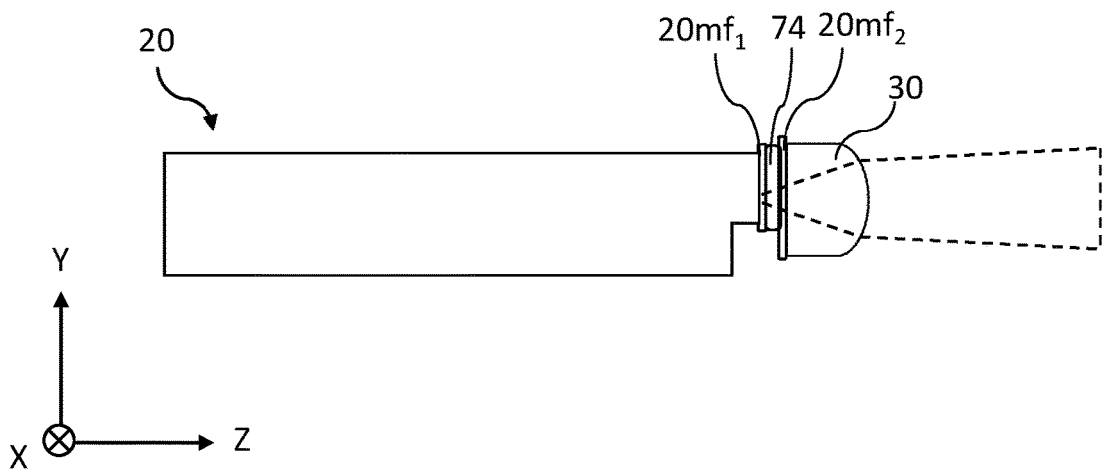
FIG. 15F is a diagram for describing an example of a step in manufacturing the laser light source in the case in which the submount and the collimating lens are bonded using an inorganic bonding member.

In the next step, the submount 20 is heated to have a temperature of 150° C. or greater and 200° C. or less. This heating is performed in order to prevent the heat that is applied to the inorganic bonding member 74 through laser irradiation from being released to the outside via the submount 20. The submount 20 may be heated by a heater. Alternatively, as shown in FIG. 15E and FIG. 15F, the submount 20 may be heated with the heat that is generated when the laser diode chip 10 emits laser light. FIG. 15E and FIG. 15F are a top plan view and a side view, respectively, schematically showing the laser light source 100 during fabrication. The regions represented by broken lines in FIG. 15E and FIG. 15F show divergence of laser light. In this step, the laser light does not need to be accurately collimated. In general, during operation of the laser light source 100, the submount 20 is disposed on a heat sink so as to allow the heat emitted from the laser diode chip 10 to be released to the outside. On the other hand, in this step of heating the submount 20, without disposing the submount 20 on a heat sink, an electric current is injected to the laser diode chip 10. In this case, when laser light is emitted from the laser diode chip 10 by injecting an electric current of about 1 A to about 2 A, the temperature of the submount 20 may exceed 200° C. In the case in which the submount 20 is disposed on a heat sink, an injected current in a range of about 7 A to about 8 A will cause the submount 20 to have a temperature of greater than 200° C.

Figure 15G:
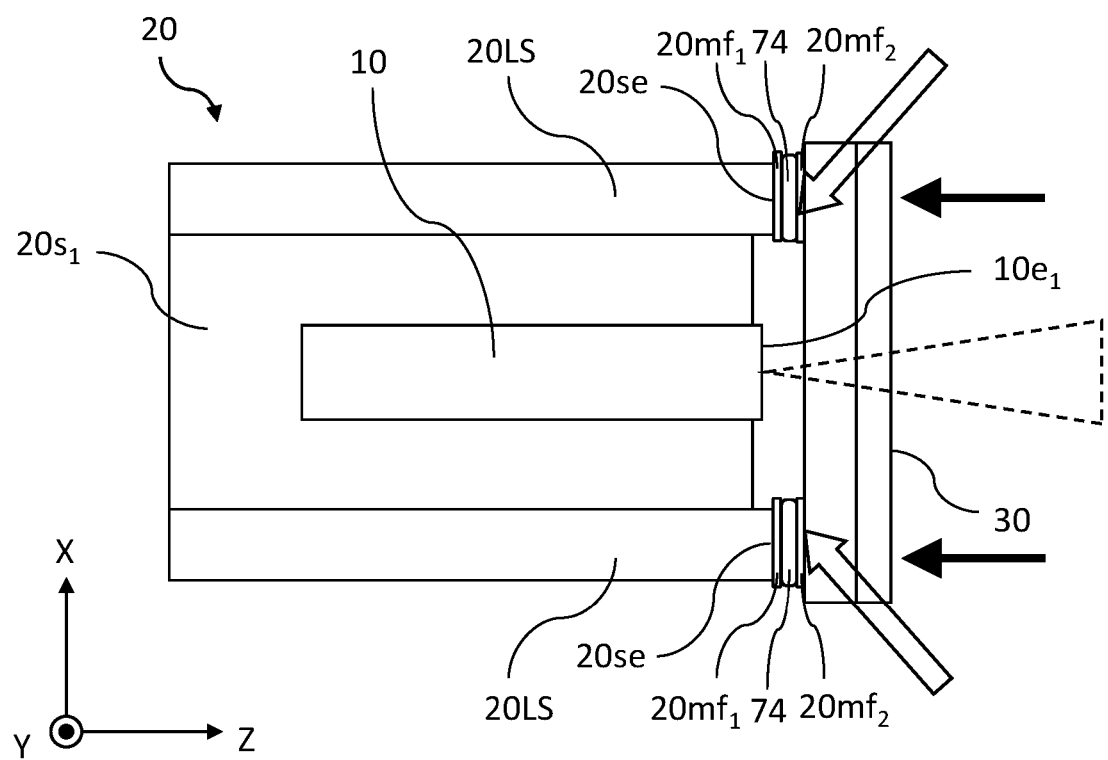
FIG. 15G is a diagram for describing an example of a step in manufacturing the laser light source in the case in which the submount and the collimating lens are bonded using an inorganic bonding member.

In the next step, as shown in FIG. 15G, by irradiating the inorganic bonding member 74 with laser light indicated by blank arrows to heat the inorganic bonding member 74, the end surfaces 20se of the pair of lens supports 20LS and the bonding surface 30s of the collimating lens 30 are bonded via the inorganic bonding member 74.

With the presence of the first metal film $20mf_1$ and the second metal film $20mf_2$, the end surfaces 20se of the pair of lens supports 20LS and the bonding surface 30s of the collimating lens 30 can be effectively bonded via the inorganic bonding member 74. During bonding, as represented by bold dark arrows, the collimating lens 30 experiences a load in a direction perpendicular to the end surfaces 20se of the pair of lens supports 20LS. Accordingly, the collimating lens 30 is shifted in the direction of the load by 2 μm ore greater and 3 μm or less. With this shift, while laser light is caused to be emitted from the laser diode chip 10, the position of the collimating lens 30 can be finely adjusted so as to accurately collimate the laser light.

As shown in FIG. 15G, the inorganic bonding member is irradiated with laser light in an oblique direction with respect to the end surfaces 20*se* of the pair of lens supports 20LS, through a side surface of the collimating lens 30. Through laser irradiation in an oblique direction, the inorganic bonding member 74 can be efficiently heated. When a YAG laser light source is used, the laser light has a near-infrared wavelength. When a laser light source other than a YAG laser light source is used, the laser light may have a wavelength of a visible light, e.g., blue or green, or an ultraviolet wavelength. As shown in FIG. 8A and FIG. 9A, when the submount 20 includes a pair of heat insulators 20*i*, the heat applied to the inorganic bonding member 74 can be restrained from being transmitted to the laser diode chip 10.

In a laser light source according to the present disclosure as manufactured through the manufacturing steps described above with reference to FIG. 15A to FIG. 15G, laser light emitted from the laser diode chip 10 can be accurately collimated.

APPLICATION EXAMPLES

A laser light source according to certain embodiments of the present disclosure can be used for light sources for a direct diode laser that combines a plurality of laser beams for an enhanced output power, for example. Combining of beams are to be performed by accurately combining laser beams that are emitted from a plurality of laser light sources. With a high-intensity laser beam having a wavelength of 570 nm or less, even a metal such as copper can be easily processed. In a laser light source according to the present disclosure, a misalignment between a laser diode chip and a lens is unlikely to occur; therefore, the optical axis of the laser light that is emitted to the outside from the laser light source will not be greatly misoriented. This allows for accurately combining laser beams that are emitted from a plurality of such laser light sources, which allows for increasing beam quality.

A laser light source according to the present disclosure can also be used for, for example, projectors and illumination devices.

In the description above, certain embodiments of the present invention are described. However, the present invention is not limited to the description above, and should be broadly construed on the basis of the claims. The present invention also encompasses variations and modifications that are made on the basis of the description above.

What is claimed is:
1. A method of manufacturing a laser light source, the method comprising:
providing a submount having a principal surface on which a laser diode chip having an emission end surface is to be fixed, wherein the submount comprises a pair of lens supports, each including an end surface, wherein the end surfaces of the pair of lens supports are located at opposite sides with respect to the emission end surface of the laser diode chip;
providing a lens having a bonding surface;
disposing a first metal film on the end surfaces of the pair of lens supports;
performing adjustment such that end surfaces of the pair of lens supports of the submount are parallel to a reference plane by performing steps comprising:
emitting laser light onto the first metal film, and
based on the laser light having been reflected at the first metal film, reducing an inclination of the end surfaces of the pair of lens supports with respect to the reference plane;
performing adjustment such that the bonding surface of the lens is parallel to the reference plane; and
while maintaining the end surfaces of the pair of lens supports and the bonding surface of the lens so as to be parallel to the reference plane, bonding the end surfaces of the pair of lens supports with the bonding surface of the lens using an inorganic bonding member.

2. The method of manufacturing a laser light source of claim 1, wherein the first metal film contains Au.

3. The method of manufacturing a laser light source of claim 1, further comprising:
disposing a second metal film on the bonding surface of the lens,
wherein the step of performing adjustment such that the bonding surface of the lens is parallel to the reference plane comprises:
emitting laser light onto the second metal film, and
based on the laser light having been reflected at the second metal film, reducing an inclination of the bonding surface of the lens with respect to the reference plane.

4. The method of manufacturing a laser light source of claim 3, wherein the second metal film contains Au.

5. The method of manufacturing a laser light source of claim 1, wherein the inorganic bonding member contains AuSn.

6. The method of manufacturing a laser light source of claim 1, wherein:
the submount further comprises a pair of heat insulators; and
each of the pair of heat insulators is provided in a path, within the submount, from a corresponding one of the pair of lens supports to a location at which the laser diode chip is fixed.

7. The method of manufacturing a laser light source of claim 1, wherein:
the submount comprises a first submount portion comprising the pair of lens supports and a second submount portion having the principal surface and; and
the first submount portion and the second submount portion are separate pieces.

8. The method of manufacturing a laser light source of claim 7, wherein:
the second submount portion is fixed to an upper surface of the first submount portion.

9. The method of manufacturing a laser light source of claim 7, wherein:
the first submount portion is fixed to an upper surface of the second submount portion.

10. A method of manufacturing a laser light source, the method comprising:
providing a submount having a principal surface, wherein the submount comprises a pair of lens supports, each including an end surface;
fixing a laser diode chip to the principal surface of the submount, the laser diode chip having an emission end surface, wherein the end surfaces of the pair of lens supports are located at opposite sides with respect to the emission end surface of the laser diode chip;
providing a lens;
connecting end surfaces of the pair of lens supports of the submount with a bonding surface of the lens via an inorganic bonding member;
after the step of fixing the laser diode chip to the principal surface, heating the submount; and
heating the inorganic bonding member through laser irradiation.

11. The method of manufacturing a laser light source of claim 10, wherein the step of heating the submount comprises heating the submount with a heater.

12. The method of manufacturing a laser light source of claim 10, wherein the step of heating the submount comprises heating the submount with heat that is generated when the laser diode chip emits laser light.

13. The method of manufacturing a laser light source of claim 10, wherein, when heating the inorganic bonding member through laser irradiation, the heated submount has a temperature of 200° C. or less.

14. The method of manufacturing a laser light source of claim 10, wherein the step of heating the inorganic bonding member through laser irradiation comprises irradiating the inorganic bonding member with laser light through the lens.

15. The method of manufacturing a laser light source of claim 10, further comprising:
    disposing a first metal film on at least one of the end surfaces of the pair of lens supports; and
    disposing a second metal film on the bonding surface of the lens.

16. The method of manufacturing a laser light source of claim 15, wherein:
    the first metal film and the second metal film contain Au; and
    the inorganic bonding member contains AuSn.

17. The method of manufacturing a laser light source of claim 10, wherein:
    the submount comprises a first submount portion comprising the pair of lens supports and a second submount portion having the principal surface and; and
    the first submount portion and the second submount portion are separate pieces.

18. The method of manufacturing a laser light source of claim 17, wherein:
    the first submount portion is fixed to an upper surface of the second submount portion.

19. A method of manufacturing a laser light source, the method comprising:
    providing a submount having a principal surface on which a laser diode chip having an emission end surface is to be fixed, wherein the submount comprises a pair of lens supports, each including an end surface, wherein the end surfaces of the pair of lens supports are located at opposite sides with respect to the emission end surface of the laser diode chip;
    providing a lens having a bonding surface;
    performing adjustment such that end surfaces of the pair of lens supports of the submount are parallel to a reference plane;
    disposing a metal film on the bonding surface of the lens;
    performing adjustment such that the bonding surface of the lens is parallel to the reference plane by performing steps comprising:
        emitting laser light onto the metal film, and
        based on the laser light having been reflected at the metal film, reducing an inclination of the bonding surface of the lens with respect to the reference plane; and
        while maintaining the end surfaces of the pair of lens supports and the bonding surface of the lens so as to be parallel to the reference plane, bonding the end surfaces of the pair of lens supports with the bonding surface of the lens using an inorganic bonding member.

20. The method of manufacturing a laser light source of claim 19, wherein
    the submount comprises a first submount portion comprising the pair of lens supports and a second submount portion having the principal surface and; and
    the first submount portion and the second submount portion are separate pieces.

21. The method of manufacturing a laser light source of claim 20, wherein:
    the first submount portion is fixed to an upper surface of the second submount portion.

* * * * *